(12) United States Patent
Inagaki

(10) Patent No.: US 9,993,840 B2
(45) Date of Patent: Jun. 12, 2018

(54) SUBSTRATE PROCESSING APPARATUS AND SUBSTRATE PROCESSING METHOD

(71) Applicant: SCREEN HOLDINGS CO., LTD., Kyoto (JP)

(72) Inventor: Yukihiko Inagaki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 112 days.

(21) Appl. No.: 15/133,685

(22) Filed: Apr. 20, 2016

(65) Prior Publication Data

US 2016/0310979 A1    Oct. 27, 2016

(30) Foreign Application Priority Data

Apr. 24, 2015   (JP) .................... 2015-089604

(51) Int. Cl.
*B05C 5/02* (2006.01)
*B05D 1/02* (2006.01)
(Continued)

(52) U.S. Cl.
CPC .............. *B05D 1/02* (2013.01); *B05C 5/0204* (2013.01); *B05C 5/0208* (2013.01); *B05D 1/005* (2013.01); *G03F 7/162* (2013.01); *H01L 21/6715* (2013.01); *H01L 21/67242* (2013.01); *H01L 21/67253* (2013.01); *H01L 21/67259* (2013.01); *B05B 13/04* (2013.01); *B05C 11/08* (2013.01)

(58) Field of Classification Search
CPC .............. B05B 12/004; B05B 13/0228; B05B 13/0278; B05B 13/04; H01L 21/67242; H01L 21/67253; H01L 21/6715; H01L 21/67259; B05C 5/0204; B05C 5/0208; B05C 11/08; B05C 11/1015; G03F 7/162; G03F 7/18
USPC ........................................................ 118/712
See application file for complete search history.

(56) References Cited

U.S. PATENT DOCUMENTS 6,320,937 B1    11/2001   Mochizuki .................... 378/143
6,496,245 B2 *  12/2002   Kosugi ..................... G03F 7/30
                                                        118/52
(Continued)

FOREIGN PATENT DOCUMENTS

JP    09-213616    8/1997
JP    11-283895    10/1999
(Continued)

*Primary Examiner* — Laura Edwards
(74) *Attorney, Agent, or Firm* — Ostrolenk Faber LLP

(57) ABSTRACT

Positions of an outer periphery of a rotating substrate and a processing liquid nozzle are detected. An amplitude of a change with time of the position of the outer periphery of the substrate detected during rotation is acquired. In a direction passing through a rotational center and parallel with the rotating substrate, a relative position of the processing liquid nozzle with respect to the spin chuck is periodically changed at a frequency equal to a rotational frequency of the spin chuck and the acquired amplitude. A difference between a phase of a change with time of the position of the processing liquid nozzle and a phase of a change with time of the position of the outer periphery of the substrate is adjusted to not more than a predetermined value. A processing liquid is discharged from the processing liquid nozzle to a peripheral portion of the rotating substrate.

12 Claims, 13 Drawing Sheets

(51) Int. Cl.
*H01L 21/67* (2006.01)
*G03F 7/16* (2006.01)
*B05D 1/00* (2006.01)
B05C 11/08 (2006.01)
B05B 13/04 (2006.01)

(56) References Cited

U.S. PATENT DOCUMENTS

| | | | |
|---|---|---|---|
| 7,198,542 B2 * | 4/2007 | Kramer | B24B 37/042 |
| | | | 451/21 |
| 8,654,325 B2 | 2/2014 | Nakamizo et al. | 356/237.2 |
| 2008/0274670 A1 * | 11/2008 | Tada | B24B 9/065 |
| | | | 451/6 |
| 2013/0084393 A1 | 4/2013 | Kashiyama et al. | 427/273 |

FOREIGN PATENT DOCUMENTS

| | | |
|---|---|---|
| JP | 2001-110712 | 4/2001 |
| JP | 2004-179211 | 6/2004 |
| JP | 3890393 | 3/2007 |
| JP | 2012-222238 | 11/2012 |
| JP | 2013-077639 | 4/2013 |

\* cited by examiner

F I G. 5
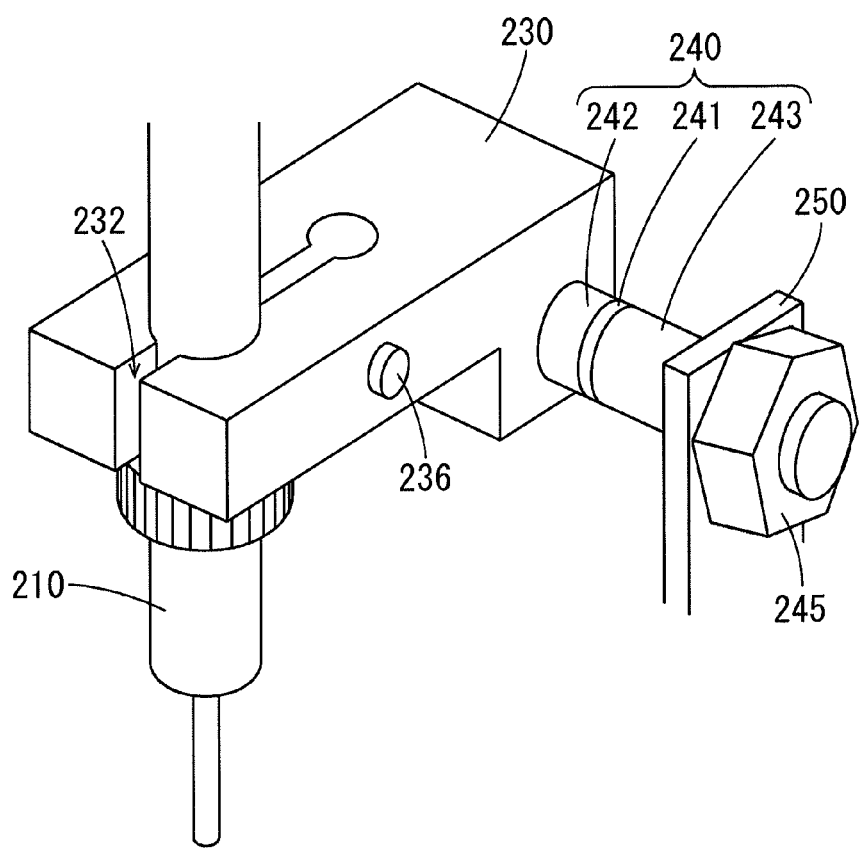

SUBSTRATE PROCESSING APPARATUS AND SUBSTRATE PROCESSING METHOD

BACKGROUND OF THE INVENTION

Field of the Invention

The present invention relates to a substrate processing apparatus and a substrate processing method for processing a substrate using a processing liquid.

Description of Related Art

In a substrate processing apparatus, a substrate horizontally supported by a spin chuck is rotated. In this state, a processing liquid is discharged from a nozzle to substantially the center of an upper surface of the substrate, whereby the processing liquid is supplied to the entire surface of the substrate. Thereafter, predetermined thermal processing is performed, so that a thin film made of the processing liquid is formed on the surface of the substrate. If the thin film is formed on a peripheral portion of the substrate, when a transport mechanism that transports the substrate holds the peripheral portion of the substrate, a film is stripped and becomes particles. Thus, in order to prevent the thin film from being formed on the peripheral portion of the substrate, processing for removing the processing liquid from the peripheral portion of the substrate is performed after the processing liquid is supplied to the entire surface of the substrate (see JP 2001-110712 A and JP 2004-179211 A, for example).

In a coating film removal device described in the JP 2001-110712 A, the position of the peripheral portion of the substrate held by the spin chuck is detected by a detection mechanism. In this state, a rotation phase of the spin chuck and the corresponding position of the peripheral portion of the substrate are acquired by the rotation of the spin chuck by 360°. A rinse liquid is discharged from a rinse liquid discharge nozzle to the peripheral portion of the rotating substrate, so that the resist liquid on the peripheral portion of the substrate is removed. During the discharge of the rinse liquid, the position of the spin chuck or the rinse liquid discharge nozzle is adjusted by an alignment mechanism such that a fluctuation amount of the position of the peripheral portion of the substrate caused by the rotation of the spin chuck is compensated.

Similarly, in the resist coating device described in JP 2004-179211 A, the peripheral portion of the substrate held by the spin chuck is imaged by a CCD (Charge-Coupled Device) camera. In this state, a relationship between a rotation angle of the substrate and a corresponding position of the peripheral portion is acquired by the rotation of the spin chuck. An edge rinse liquid is discharged to the peripheral portion of the substrate while an edge rinse nozzle is moved in a radial direction in accordance with the position of the peripheral portion of the substrate during the rotation of the substrate using the relationship between the rotation angle of the substrate and the position of the peripheral portion.

BRIEF SUMMARY OF THE INVENTION

Conventionally, it was considered that the processing for the peripheral portion of the substrate could be performed with high accuracy by the methods described in JP 2001-110712 A and JP 2004-179211 A. However, it is actually difficult to perform processing on a region having a constant width at the peripheral portion of the substrate while the nozzle is being moved in a radial direction. Therefore, a substrate processing apparatus capable of processing the peripheral portion of the substrate with high accuracy while moving the nozzle in the radial direction has not been realized.

In recent years, it is desired that the width of the peripheral portion of the substrate from which a thin film is removed is more sufficiently reduced in order to increase a region of the substrate that can be utilized for fabricating a product. Therefore, it is desired that the processing for the peripheral portion of the substrate is performed with high accuracy.

An object of the present invention is to provide a substrate processing apparatus and a substrate processing method by which processing for a peripheral portion of a substrate can be performed with high accuracy.

In the conventional processing for the peripheral portion of the substrate, the position of the peripheral portion of the substrate was detected. However, it was considered that the position of the nozzle was known. However, uncertainty of about several hundreds μm is present at the position of the nozzle due to mechanical accuracy of members that constitute a nozzle movement mechanism, or eccentricity, play (backlush) or the like of the rotation member. Such uncertainty of the position was sufficiently small as compared to the measurement of the nozzle, thereby not being considered in the processing for the peripheral portion of the substrate. In the case where the processing for the peripheral portion of the substrate is performed with high accuracy, the inventor of the present invention has discovered that the above-mentioned uncertainty of the position is an element that cannot be ignored, and devised the following invention.

(1) According to a substrate processing apparatus according to one aspect of the present invention that performs processing on a substrate having an at least partially circular outer periphery includes a rotation holder configured to hold and rotate the substrate, a nozzle mechanism including a processing liquid nozzle that discharges a processing liquid to a peripheral portion of the substrate rotated by the rotation holder, a position adjuster provided to be capable of adjusting a relative position of the processing liquid nozzle with respect to the rotation holder in a direction passing through a rotational center of the rotation holder and parallel with the substrate rotated by the rotation holder, a position detector arranged to detect a position of the outer periphery of the substrate held by the rotation holder and a position of the processing liquid nozzle, a change amount acquirer that acquires an amplitude of a change with time of the position of the outer periphery of the substrate detected by the position detector during rotation of the substrate by the rotation holder as a first amplitude, a position controller that controls the position adjuster such that the relative position of the processing liquid nozzle with respect to the rotation holder is periodically changed at a frequency equal to a rotational frequency of the rotation holder, and the first amplitude acquired by the change amount acquirer, a phase controller that controls the position adjuster such that a difference between a phase of a change with time of the position of the processing liquid nozzle detected by the position detector and a phase of a change with time of the position of the outer periphery of the substrate detected by the position detector is not more than a predetermined value, and a discharge controller that controls the nozzle mechanism such that a processing liquid is discharged from the processing liquid nozzle after the position adjuster is controlled by the phase controller.

In this substrate processing apparatus, the substrate is held and rotated by the rotation holder. The position of the outer periphery of the substrate held by the rotation holder and the position of the processing liquid nozzle are detected by the position detector. The relative position of the processing liquid nozzle with respect to the rotation holder can be adjusted by the position adjuster in a direction passing through the rotational center of the rotation holder and parallel with the substrate rotated by the rotation holder. The amplitude of the change with time of the position of the outer periphery of the substrate detected by the position detector during the rotation of the substrate by the rotation holder is acquired as the first amplitude.

The relative position of the processing liquid nozzle with respect to the rotation holder is periodically changed by the position adjuster at the frequency equal to the rotational frequency of the rotation holder, and the first amplitude. Thereafter, a difference between the phase of the change with time of the position of the processing liquid nozzle detected by the position detector and the phase of the change with time of the position of the outer periphery of the substrate detected by the position detector (hereinafter simply referred to as a phase difference) is adjusted to not more than a predetermined value by the position adjuster. When the phase difference is not more than the predetermined value, the processing liquid nozzle is moved to track the change of the position of the outer periphery of the substrate. In this state, the processing liquid is discharged from the processing liquid nozzle to the peripheral portion of the rotating substrate.

This configuration enables the change of the relative position of the processing liquid nozzle with respect to the rotation holder to be accurately synchronized with the change of the position of the outer periphery of the substrate. Thus, the processing liquid nozzle can be arranged at a desired position in the peripheral portion of the substrate with high accuracy. As a result, the processing for the peripheral portion of the substrate can be performed with high accuracy.

(2) The change amount acquirer may acquire an amplitude of a change with time of the difference between the position of the outer periphery of the substrate detected by the position detector and the position of the processing liquid nozzle detected by the position detector during the rotation of the substrate by the rotation holder as a second amplitude, and the phase controller may control the position adjuster such that the second amplitude acquired by the change amount acquirer is not more than a predetermined threshold value.

In this case, the smaller the phase difference is, the smaller the second amplitude is. Thus, whether the phase difference is not more than the predetermined value can be easily determined using the second amplitude at a high speed. Thus, the processing for the peripheral portion of the substrate can be efficiently performed.

(3) The threshold value may be 50 μm. In this case, the processing for the peripheral portion of the substrate can be performed with sufficiently high accuracy.

(4) The phase controller may control the position adjuster such that the second amplitude acquired by the change amount acquirer is minimized. In this case, the processing for the peripheral portion of the substrate can be performed with more sufficiently high accuracy.

(5) Resolution power of position adjustment of the position adjuster may be not more than 50 μm. In this case, the processing liquid nozzle can be moved with high accuracy. Therefore, the processing for the peripheral portion of the substrate can be easily performed with high accuracy.

(6) The position adjuster may include a piezoelectric element or a voice coil motor. In this case, the processing liquid nozzle can be moved with high accuracy and high responsivity. Therefore, the processing for the peripheral portion of the substrate can be easily performed with high accuracy.

(7) The nozzle mechanism may include a nozzle supporter that supports the processing liquid nozzle, and the position adjuster may be provided in the nozzle supporter. In this case, it is not necessary to use a large-size position adjuster at the nozzle supporter. Therefore, the substrate processing apparatus can be made compact. Further, the processing liquid nozzle is light, so that the energy for driving the position adjuster can be reduced.

(8) The position detector may include a common detector that detects the position of the outer periphery of the substrate and the position of the processing liquid nozzle. In this case, it is not necessary to provide a plurality of detectors in the substrate processing apparatus. Therefore, an increase in size of the substrate processing apparatus can be prevented.

(9) The position detector may include a first detector that detects the position of the outer periphery of the substrate and a second detector that detects the position of the processing liquid nozzle. In this case, the position of the outer periphery of the substrate and the position of the processing liquid nozzle are detected by separate detectors. Therefore, the flexibility of the arrangement of the processing liquid nozzle can be improved without restriction on a positional relationship between the outer periphery of the substrate and the processing liquid nozzle.

(10) The position detector may produce image data indicating images of the outer periphery of the substrate and the processing liquid nozzle, and may detect the position of the outer periphery of the substrate and the position of the processing liquid nozzle based on the produced image data, and the change amount acquirer may acquire the first amplitude by processing the image data produced by the position detector. In this case, the first amplitude can be easily and accurately acquired using the image processing.

(11) The processing liquid nozzle may discharge a removal liquid that removes a liquid applied to the peripheral portion of the substrate as a processing liquid. In this case, the substrate processing apparatus can perform the substrate processing for removing the liquid applied to the peripheral portion of the substrate.

(12) The processing liquid nozzle may discharge a processing liquid for forming a processing film on the peripheral portion of the substrate. In this case, the substrate processing apparatus can perform the substrate processing for forming a processing film on the peripheral portion of the substrate.

(13) According to another aspect of the present invention, a substrate processing method for performing processing on a substrate having an at least partially circular outer periphery includes the steps of holding and rotating the substrate by a rotation holder, detecting a position of the outer periphery of the substrate held by the rotation holder and a position of a processing liquid nozzle by a position detector, acquiring an amplitude of a change with time of the position of the outer periphery of the substrate detected by the position detector during rotation of the substrate by the rotation holder as a first amplitude, periodically changing a relative position of the processing liquid nozzle with respect to the rotation holder by a position adjuster at a frequency equal to a rotational frequency of the rotation holder, and the first amplitude in a direction passing through a rotational center of rotation holder and parallel with the substrate rotated by the rotation holder, adjusting a difference between a phase of a change with time of the position of the processing liquid nozzle detected by the position detector and a phase of a change of the position of the outer periphery of the substrate detected by the position detector to not more than a predetermined value by the position adjuster, and discharging a processing liquid from the processing liquid nozzle to a peripheral portion of the rotating substrate after the difference between the phases is not more than the predetermined value.

In this substrate processing method, the substrate is held and rotated by the rotation holder. The position of the outer periphery of the substrate held by the rotation holder and the position of the processing liquid nozzle are detected by the position detector. The relative position of the processing liquid nozzle with respect to the rotation holder can be adjusted by the position adjuster in a direction passing through the rotational center of the rotation holder and parallel with the substrate rotated by the rotation holder. The amplitude of the change with time of the position of the outer periphery of the substrate detected by the position detector during the rotation of the substrate by the rotation holder is acquired as the first amplitude.

The relative position of the processing liquid nozzle with respect to the rotation holder is periodically changed by the position adjuster at a frequency equal to the rotational frequency of the rotation holder, and the first amplitude. Thereafter, the difference between the change with time of the position of the processing liquid nozzle detected by the position detector and the phase of the change with time of the position of the outer periphery of the substrate detected by the position detector is adjusted to not more than the predetermined value by the position adjuster. When the phase difference is not more than the predetermined value, the processing liquid nozzle is moved to track the change of the position of the outer periphery of the substrate. In this state, the processing liquid is discharged from the processing liquid nozzle to the peripheral portion of the rotating substrate.

This method enables the change of the relative position of the processing liquid nozzle with respect to the rotation holder to be accurately synchronized with the change of the position of the outer periphery of the substrate. Thus, the processing liquid nozzle can be arranged at a desired position in the peripheral portion of the substrate with high accuracy. As a result, the processing for the peripheral portion of the substrate can be performed with high accuracy.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 5 is a perspective view showing fixing steps of the one processing liquid nozzle provided in the coating processing unit of FIG. 2;

DESCRIPTION OF THE PREFERRED EMBODIMENTS (1) Configuration of Substrate Processing Apparatus A substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, the substrate used in the present embodiment has an at least partially circular outer periphery. For example, an outer periphery except for a notch for positioning is circular.

Figure 1:
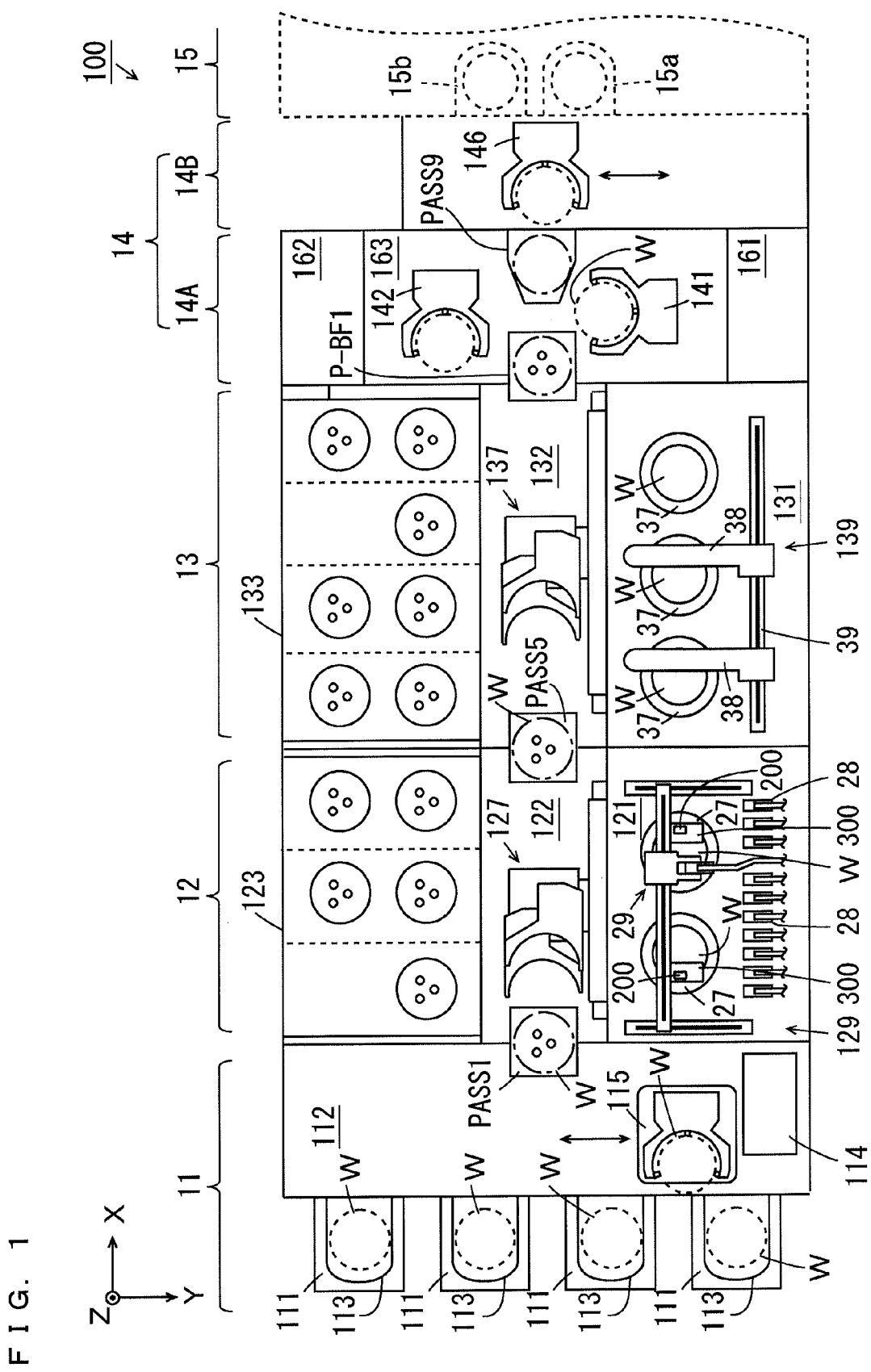
FIG. 1 is a schematic plan view of a substrate processing apparatus according to one embodiment of the present invention.

FIG. 1 is a schematic plan view of the substrate processing apparatus according to one embodiment of the present invention. FIG. 1 and the subsequent drawings are accompanied by the arrows that indicate X, Y, and Z directions orthogonal to one another for the clarity of a positional relationship. The X and Y directions are orthogonal to each other within a horizontal plane, and the Z direction corresponds to a vertical direction. For each direction, a direction in which an arrow is directed is a + direction, and the opposite direction is a − direction.

As shown in FIG. 1, the substrate processing apparatus 100 includes an indexer block 11, a first processing block 12, a second processing block 13, a cleaning drying processing block 14A and a carry-in carry-out (indexer) block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method.

As shown in FIG. 1, the indexer block 11 includes a plurality of carrier platforms 111 and a transport section (a transport space) 112. In each carrier platform 111, a carrier 113 for storing the plurality of substrates W in multiple stages is placed. In the transport section 112, a main controller 114 and a transport mechanism (a transport robot) 115 are provided. The main controller 114 controls various constituent elements of the substrate processing apparatus 100. The transport mechanism 115 holds and transports the substrate W.

The first processing block 12 includes a coating processing section (a coating processing space) 121, a transport section 122 and a thermal processing section (a thermal processing space) 123. The coating processing section 121 and the thermal processing section 123 are opposite to each other with the transport section 122 sandwiched therebetween. Substrate platforms PASS1 to PASS4 (see FIG. 14) on which the substrates W are placed are provided between the transport section 122 and the indexer block 11. Transport mechanisms (transport robots) 127, 128 (see FIG. 14), which transport the substrates W, are provided in the transport section 122.

The second processing block 13 includes a coating development processing section (a coating development processing space) 131, a transport section 132 and a thermal processing section 133. The coating development processing section 131 and the thermal processing section 133 are opposite to each other with the transport section 132 sandwiched therebetween. Substrate platforms PASS5 to PASS8 (see FIG. 14) on which the substrates W are placed are provided between the transport section 132 and the transport section 122. Transport mechanisms (transport robots) 137, 138 (see FIG. 14), which transport the substrates W, are provided in the transport section 132.

The cleaning drying processing block 14A includes cleaning drying processing sections (cleaning drying processing spaces) 161, 162 and a transport section 163. The cleaning drying processing sections 161, 162 are opposite to each other with the transport section 163 sandwiched therebetween. Transport mechanisms (transport robots) 141, 142 are provided in the transport section 163.

Placement buffer units P-BF1, P-BF2 (see FIG. 14) are provided between the transport section 163 and the transport section 132. The placement buffer units P-BF1, P-BF2 are configured to be capable of storing the plurality of substrates W.

Further, a substrate platform PASS9, and placement cooling platforms P-CP (see FIG. 14) that are described below are provided to be adjacent to the carry-in carry-out block 14B between the transport mechanisms 141, 142. Each placement cooling platform P-CP includes a function of cooling the substrate W (a cooling plate, for example). In the placement cooling platform P-CP, the substrate W is cooled to a temperature suitable for the exposure processing.

A transport mechanism (a transport robot) 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided in the exposure device 15.

(2) Coating Processing Section and Coating Development Processing Section

Figure 2:
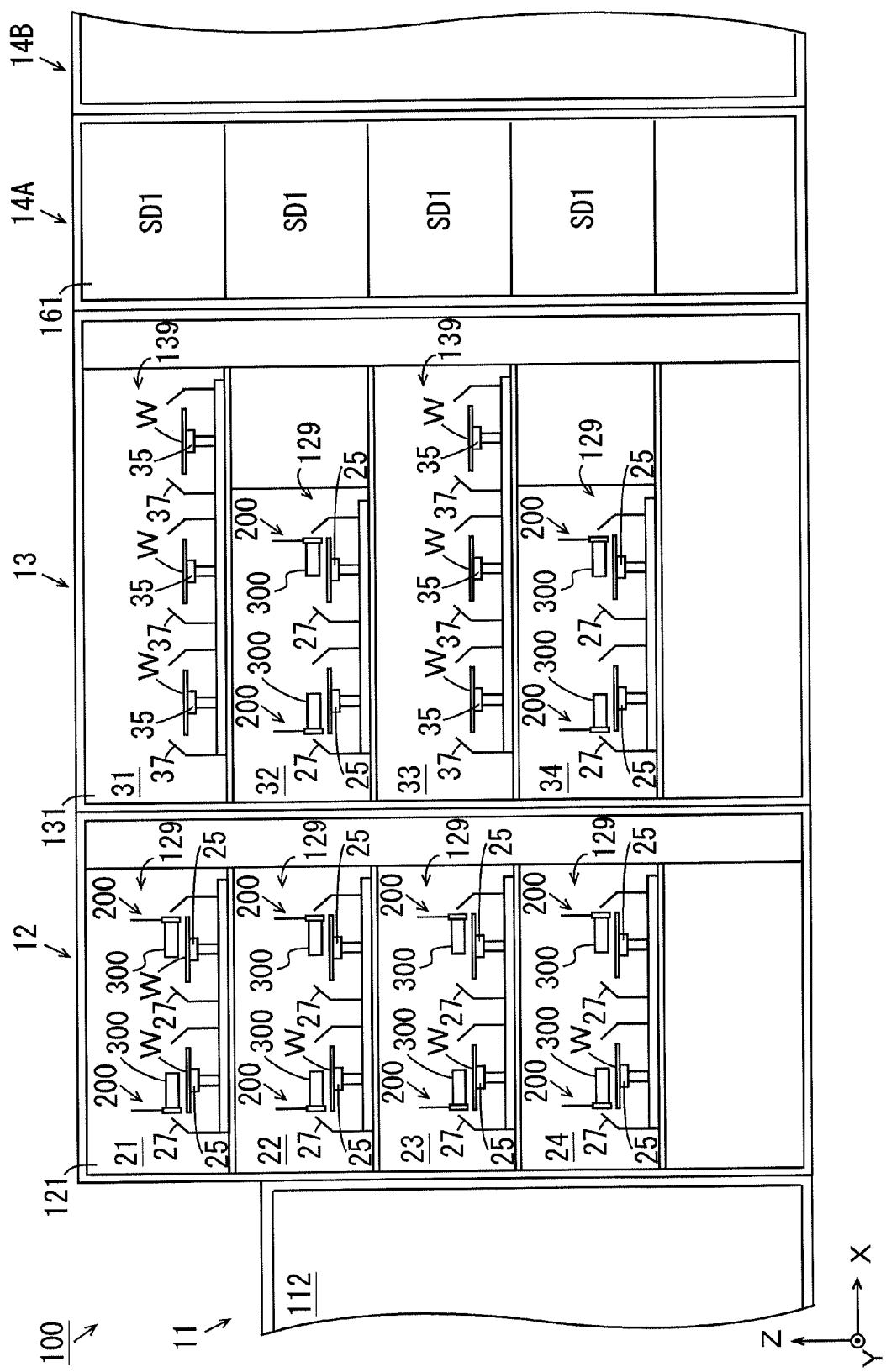
FIG. 2 is a schematic side view showing the inner configuration of a coating processing section, a coating development processing section and a cleaning drying processing section of FIG. 1.

FIG. 2 is a schematic side view showing the inner configuration of the coating processing section 121, the coating development processing section 131 and the cleaning drying processing section 161 of FIG. 1. As shown in FIG. 2, in the coating processing section 121, coating processing chambers 21, 22, 23, 24 are provided in a stack. In each coating processing chamber 21 to 24, a coating processing unit (a coater) 129 is provided. In the coating development processing section 131, development processing chambers 31, 33 and the coating processing chambers 32, 34 are provided in a stack. In each of the development processing chambers 31, 33, a development processing unit (a developer) 139 is provided. In each of the coating processing chambers 32, 34, a coating processing unit 129 is provided.

Figure 3:
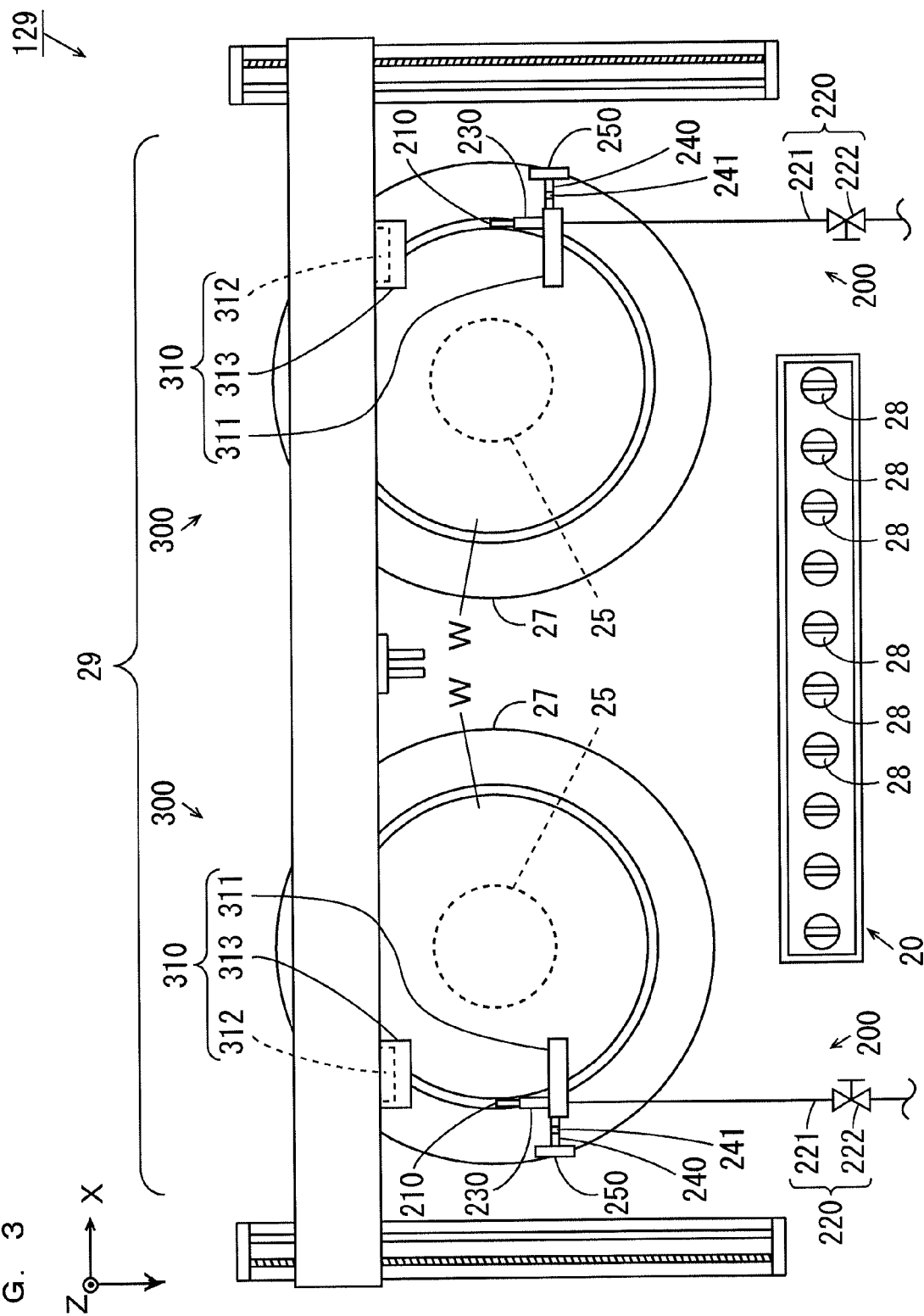
FIG. 3 is a plan view showing the configuration of a coating processing unit.

FIG. 3 is a plan view showing the configuration of the coating processing unit 129. As shown in FIGS. 2 and 3, each coating processing unit 129 includes a waiting section (a waiting space) 20, a plurality of spin chucks 25, a plurality of cups 27, a plurality of processing liquid nozzles 28, a nozzle transport mechanism (a nozzle transport robot) 29, a plurality of nozzle mechanisms 200, and a plurality of position detection units (position detectors) 300. In the present embodiment, two spin chucks 25, two cups 27, two nozzle mechanisms 200 and two position detection units 300 are provided in each coating processing unit 129.

The nozzle mechanism 200 includes a processing liquid nozzle 210, a rinse liquid supply system 220, a nozzle supporter 230, a nozzle fixing portion 240, and a nozzle attachment portion 250. The rinse liquid supply system 220 includes a pipe 221 and a valve 222. The processing liquid nozzle 210 is connected to a rinse liquid storage tank (not shown) by the pipe 221. The valve 222 is inserted into the pipe 221. Details of the nozzle mechanism 200 will be described below.

Each spin chuck 25 is driven to be rotated by a driving device such as an electrical motor (not shown) while holding the substrate W. Each cup 27 is provided to surround the spin chuck 25. During the wait, each processing liquid nozzle 28 is inserted into the waiting section 20. Various types of processing liquids, described below, are supplied from a processing liquid storage (not shown) to each processing liquid nozzle 28 through a processing liquid pipe.

Any processing liquid nozzle 28 of the plurality of processing liquid nozzles 28 is moved to a position above the substrate W by the nozzle transport mechanism 29. The processing liquid is discharged from the processing liquid nozzle 28 while the spin chuck 25 is rotated, whereby the processing liquid is applied to the upper surface of the rotating substrate W.

Further, the processing liquid nozzle 210 of the nozzle mechanism 200 is moved from a predetermined waiting position to a position in the vicinity of the peripheral portion of the substrate W. A rinse liquid is discharged from the processing liquid nozzle 210 to the peripheral portion of the rotating substrate W while the spin chuck 25 is rotated, whereby a peripheral portion of the processing liquid applied to the substrate W is dissolved. Thus, the processing liquid on the peripheral portion of the substrate W is removed.

In the present embodiment, a processing liquid for an anti-reflection film (an anti-reflection liquid) is discharged from the processing liquid nozzle 28 in each of the coating processing chambers 22, 24 of FIG. 2. A processing liquid for a resist film (a resist liquid) is discharged from the processing liquid nozzle 28 in each of the coating processing chambers 21, 22. A processing liquid for a resist cover film (a resist cover liquid) is discharged from the processing liquid nozzle 28 in each of the coating processing chambers 32, 34, As shown in FIG. 2, each development processing unit 139 includes a plurality of spin chucks 35 and a plurality of cups 37 similarly to the coating processing unit 129. Further, as shown in FIG. 1, the development processing unit 139 includes two slit nozzles 38 for discharging a development liquid and a movement mechanism 39 for moving these slit nozzles 38.

In the development processing unit 139, a spin chuck 35 is rotated by a driving device (not shown). Thus, the substrate W is rotated. In this state, a development liquid is supplied to each substrate W while the slit nozzle 38 is moved. Thus, the resist cover film on the substrate W is removed, and the development processing for the substrate W is performed.

A plurality (four in the present example) of cleaning drying processing units SD1 are provided in the cleaning drying processing section 161. In each cleaning drying processing section SD1, cleaning and drying processing for the substrate W before the exposure processing are performed.

(3) Details of Substrate Peripheral Portion Processing (a) Nozzle Mechanism

Figure 4:
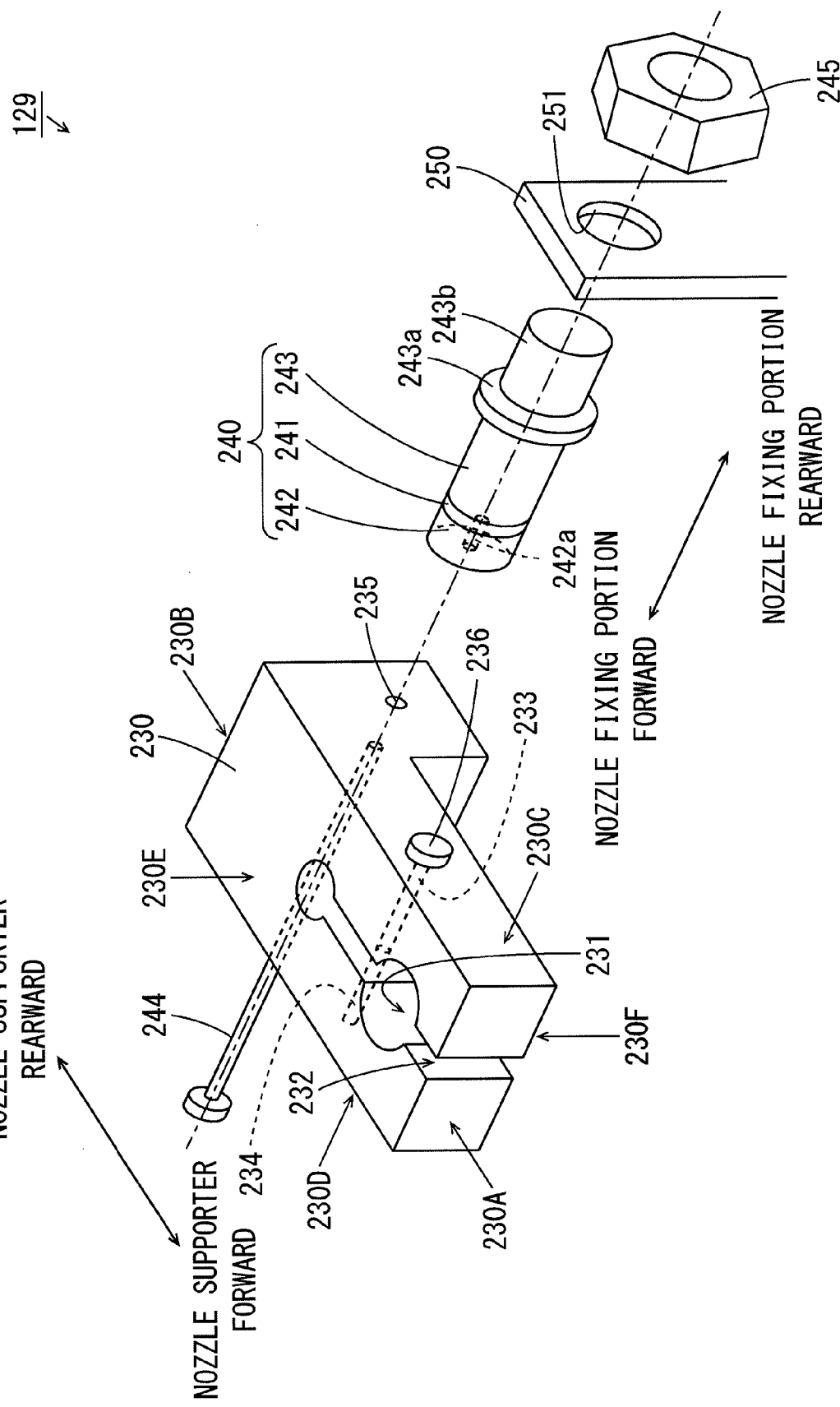
FIG. 4 is a perspective view showing fixing steps of one processing liquid nozzle provided in the coating processing unit of FIG. 2.

FIGS. 4 and 5 are perspective views showing fixing steps of one processing liquid nozzle 210 provided in the coating processing unit 129 of FIG. 2. The fixing steps of the other processing liquid nozzle 210 provided in the coating processing unit 129 is similar to the fixing steps of the processing liquid nozzle 210 of FIGS. 4 and 5.

As shown in FIG. 4, the nozzle supporter 230 has a front surface 230A, a back surface 230B, one side surface 230C, the other side surface 230D, an upper surface 230E, and a lower surface 230F. In FIG. 4, a direction in which the front surface 230A of the nozzle supporter 230 is directed is forward of the nozzle supporter 230, and a direction in which the back surface 230B of the nozzle supporter 230 is directed is rearward of the nozzle supporter 230. In the present example, the nozzle supporter 230 is a block having an L-shape cross section of which a rear end projects downward.

A circular through hole 231 penetrating from the upper surface 230E to the lower surface 230F is formed in the nozzle supporter 230. A diameter of the through hole 231 is slightly larger than a diameter of the processing liquid nozzle 210 of FIG. 5. Further, in the nozzle supporter 230, a cutout 232, which penetrates from the upper surface 230E to the lower surface 230F and separates the front end sideward, is formed to intersect with the through hole 231.

A through hole 233 penetrating from one side surface 230C to the cutout 232 is formed in the front end of the nozzle supporter 230. Further, a screw hole 234 penetrating from the other side surface 230D to the cutout 232 and connecting to the through hole 233 is formed in the front end of the nozzle supporter 230. At the rear end of the nozzle supporter 230, a through hole 235 penetrating from the one side surface 230C to the other side surface 230D is formed.

The nozzle fixing portion 240 includes a disc-shape position adjuster 241, and substantially columnar fixing members 242, 243. The position adjuster 241 is an actuator, for example. Resolution power of the position adjuster 241 is preferably not more than 50 μm. Further, the position adjuster 241 preferably has high responsivity. In the present example, the position adjuster 241 includes a piezoelectric element.

The position adjuster 241 is fixed to a position between the fixing members 242, 243 by an adhesive, for example. Thus, a substantially columnar nozzle fixing portion 240 extending in one direction is formed. In FIG. 4, a direction in which the fixing member 242 is arranged is the forward of the nozzle fixing portion 240, and a direction in which the fixing member 243 is arranged is the rearward of the nozzle fixing portion 240.

A screw hole 242a penetrating in a front-and-rear direction is formed in the fixing member 242. A flange portion 243a is formed at substantially the center in the front-and-rear direction of the fixing member 243. A male screw 243b is formed at the rear end of the fixing member 243 that is located at a position further rearward than the flange portion 243a.

The nozzle attachment portion 250 has a flat plate-shape. The nozzle attachment portion 250 is provided to be substantially vertical in each coating processing chamber 21 to 24, 32, 34 of FIG. 2. A distance between the rotational center shaft of the spin chuck 25 of FIG. 3 and the nozzle attachment portion 250 corresponding to the spin chuck 25 is constant. A circular through hole 251 is formed in the nozzle attachment portion 250. The diameter of the through hole 251 is slightly larger than the diameter of the male screw 243b of the nozzle fixing portion 240.

A fixing screw 244 is inserted into a through hole 235 from the other side surface 230D to the one side surface 230C of the nozzle supporter 230. In this state, a tip end of the fixing screw 244 is fitted into the screw hole 242a of the nozzle fixing portion 240. Thus, the nozzle supporter 230 is fixed to the nozzle fixing portion 240.

The male screw 243b of the nozzle fixing portion 240 is inserted into the through hole 251 of the nozzle attachment portion 250. In this state, the male screw 243b is fitted into a nut 245. In this case, the nozzle attachment portion 250 is sandwiched by the flange portion 243a of the nozzle fixing portion 240 and the nut 245. Thus, the nozzle fixing portion 240 is fixed to the nozzle attachment portion 250.

The processing liquid nozzle 210 (FIG. 5) is inserted into the through hole 231 of the nozzle supporter 230 such that a discharge port is directed downward. In this state, a fixing screw 236 is fitted into the screw hole 234 through the through hole 233 of the nozzle supporter 230. In this case, the fixing screw 236 inserted into the through hole 233 of the one side surface 230C of the nozzle supporter 230 is fixed to the screw hole 234 of the other side surface 230D of the nozzle supporter 230 through the cutout 232.

The fixing screw 236 is fastened, so that the size of the spacing of the cutout 232 of the nozzle supporter 230 is reduced, and the processing liquid nozzle 210 inserted into the through hole 231 is fastened by the one side surface 230C and the other side surface 230D. Thus, as shown in FIG. 5, the processing liquid nozzle 210 is fixed to the nozzle supporter 230.

The processing liquid nozzle 210 is fixed in each coating processing chamber 21 to 24, 32, 34 by the above-mentioned attachment steps. In the substrate processing for the peripheral portion (hereinafter referred to as substrate peripheral portion processing), a relative position of the processing liquid nozzle 210 with respect to the spin chuck 25 is adjusted by the extension and contraction of the position adjuster 241 of the nozzle fixing portion 240. A peripheral portion of the substrate W refers to a region that extends inward from the outer periphery of the substrate W by a predetermined width.

(b) Position Detection Unit

Figure 6:
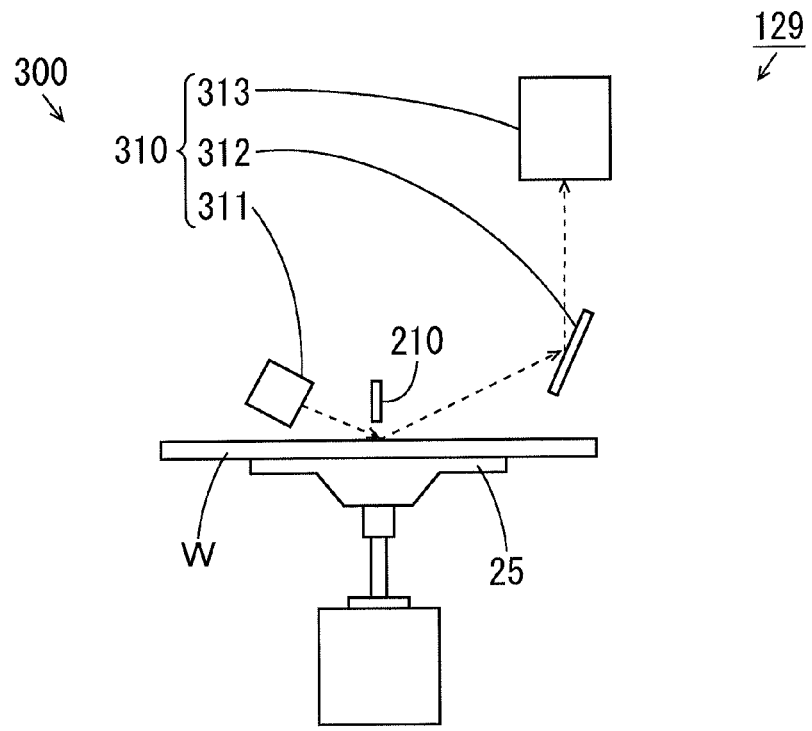
FIG. 6 is a schematic side view of one position detection unit provided in the coating processing unit of FIG. 2.
Figure 7:
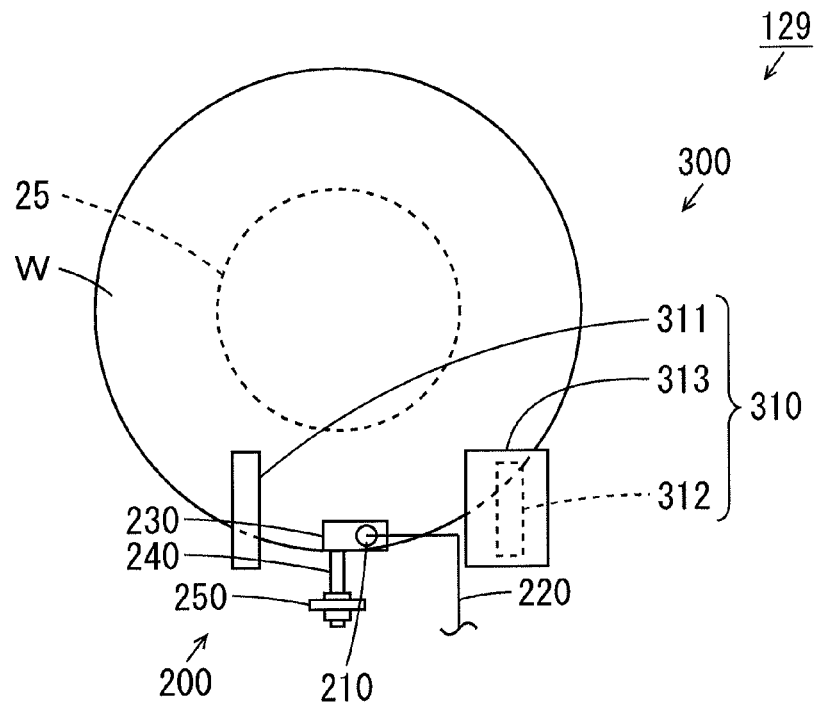
FIG. 7 is a schematic plan view of the position detection unit of FIG. 6.

FIG. 6 is a schematic side view of one position detection unit 300 provided in the coating processing unit 129 of FIG. 2. FIG. 7 is a schematic plan view of the position detection unit 300 of FIG. 6. The configuration of the other position detection unit 300 provided in the coating processing unit 129 is similar to the configuration of the position detection unit 300 of FIGS. 6 and 7.

In the present embodiment, as shown in FIGS. 6 and 7, the position detection unit 300 is constituted by a single imaging device 310. The imaging device 310 includes an illumination portion 311, a reflection mirror 312 and a CCD (Charge-Coupled Device) line sensor 313.

The illumination portion 311 is arranged above the peripheral portion of the substrate W. The reflection mirror 312 is arranged above the substrate W to be opposite to the illumination portion 311 with the processing liquid nozzle 210 sandwiched therebetween. The CCD line sensor 313 is arranged above the reflection mirror 312. The CCD line sensor 313 is arranged such that pixels are arranged in one row.

Strip-shape light (hereinafter referred to as illumination light) is generated from the illumination portion 311. A peripheral portion of the substrate W is irradiated with the illumination light. Further, a tip end of the processing liquid nozzle 210 is irradiated with part of the illumination light. The irradiated illumination light is reflected on the substrate W, and further reflected on the reflection mirror 312, and is detected by the CCD line sensor 313.

Thus, a region in the vicinity of the peripheral portion of the substrate W is imaged, and the tip end of the processing liquid nozzle 210 is imaged. Image data showing the images of the region in the vicinity of the peripheral portion of the substrate W and the tip end of the processing liquid nozzle 210 is supplied to a local controller of FIG. 8, described below.

(c) Local Controller

Figure 8:
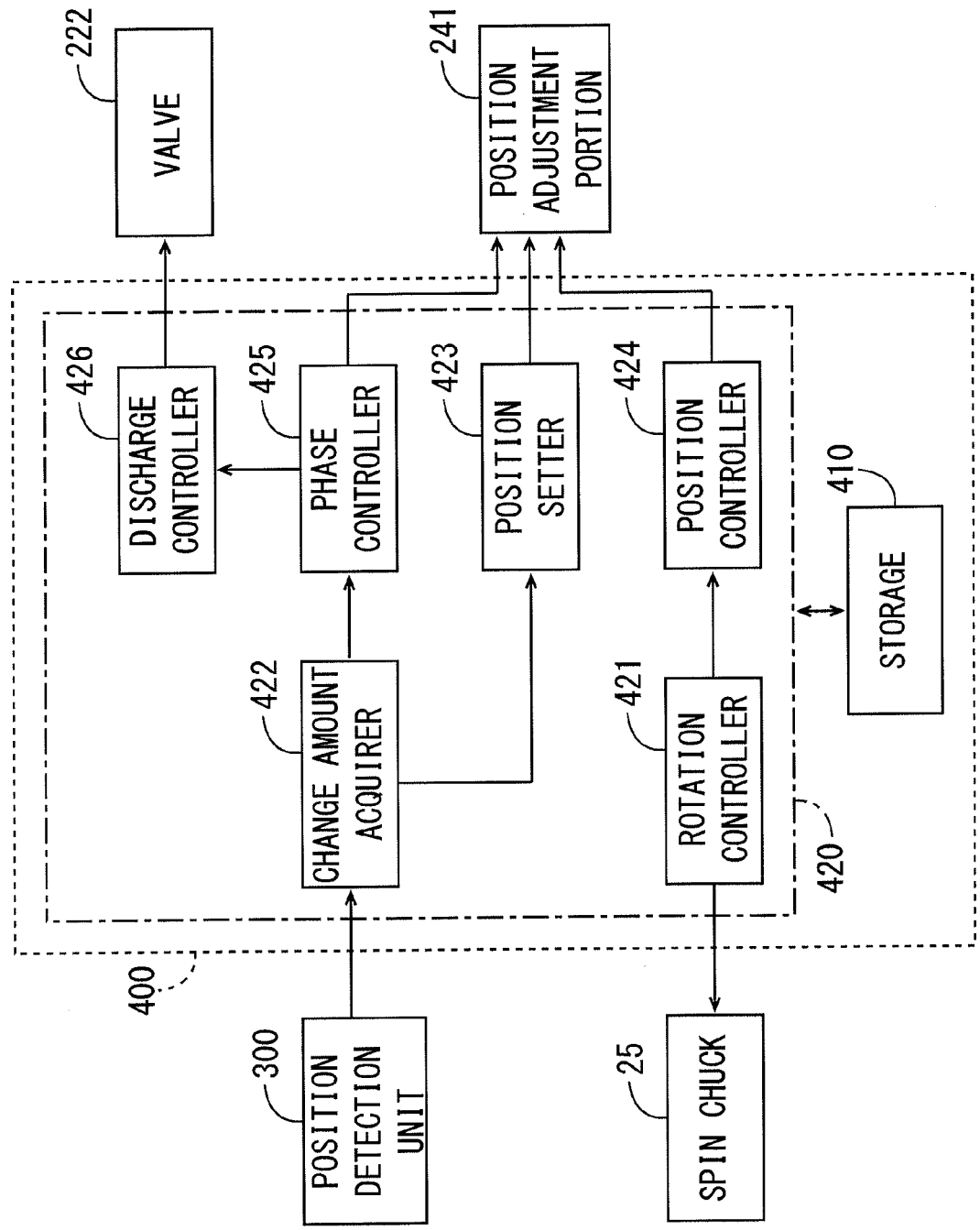
FIG. 8 is a block diagram showing the configuration of a local controller.

FIG. 8 is a block diagram showing the configuration of the local controller. The local controller 400 controls an operation of the nozzle mechanism 200 based on the instruction from the main controller 114 of FIG. 1.

As shown in FIG. 8, the local controller 400 includes a storage 410 and a controller 420. The storage 410 is constituted by a Random Access Memory (RAM) or a hard disc. In the storage 410, a program for controlling the operation of the first processing block 12 (FIG. 1) including the nozzle mechanism 200 is stored, and various data is stored.

The width of the region at the peripheral portion of the substrate W for which the substrate peripheral portion processing is performed is referred to as a peripheral portion processing width. In the present embodiment, the peripheral portion processing width is the width of the region from which the processing liquid is removed in the peripheral portion of the substrate W. The peripheral portion processing width is set in advance, and stored in the storage 410.

The controller 420 is constituted by a Central Processing Unit (CPU). The controller 420 includes a rotation controller 421, a change amount acquirer 422, a position setter 423, a position controller 424, a phase controller 425, and a discharge controller 426. The functions of the rotation controller 421, the change amount acquirer 422, the position setter 423, the position controller 424, the phase controller 425 and the discharge controller 426 are realized by execution of the program stored in the storage 410 by the controller 420.

The rotation controller 421 controls the operation of the spin chuck 25. Specifically, the rotation controller 421 gives instructions to hold, rotate and stop the substrate W to the spin chuck 25, and performs the control of the rotation speed of the spin chuck 25, and the like. The change amount acquirer 422 acquires the image data indicating the images of the region in the vicinity of the peripheral portion of the substrate W and the tip end of the processing liquid nozzle 210 from the position detection unit 300. Further, the change amount acquirer 422 acquires the data and the like indicating the change with time of the position of the outer periphery of the substrate W by performing image processing on the acquired image data.

The position setter 423 acquires the position of the outer periphery of the substrate W and the position of the tip end of the processing liquid nozzle 210 based on a result of the image processing performed by the change amount acquirer 422. Further, the position setter 423 controls the position adjuster 241 such that a distance between the outer periphery of the substrate W and the tip end of the processing liquid nozzle 210 is the peripheral portion processing width.

The position controller 424 acquires a rotation speed (a rotational frequency) of the spin chuck 25 by the rotation controller 421, and acquires an amplitude $\Delta A$ acquired by the change amount acquirer 422. Further, the position controller 424 controls the position adjuster 241 such that the position of the tip end of the processing liquid nozzle 210 (FIG. 3) periodically changes towards the rotational center of the spin chuck 25. The frequency of change of the position of the processing liquid nozzle 210 is equal to the rotational frequency of the spin chuck 25, and the amplitude of the change of the position of the processing liquid nozzle 210 is equal to the amplitude of the change with time of the position of the outer periphery of the substrate W.

The phase controller 425 controls the position adjuster 241 based on the result of image processing by the change amount acquirer 422 such that a phase of the change with time of the position of the processing liquid nozzle 210 with respect to the outer periphery of the substrate W substantially coincides with a phase of the change of the position of the outer periphery of the substrate W. After the phases substantially coincide with each other by the phase controller 425, the discharge controller 426 controls the valve 222 such that the processing liquid is discharged from the processing liquid nozzle 210. Thus, the processing liquid in the region having the peripheral portion processing width in the peripheral portion of the substrate W is removed.

(d) Control of Position Adjuster

Figure 9A:
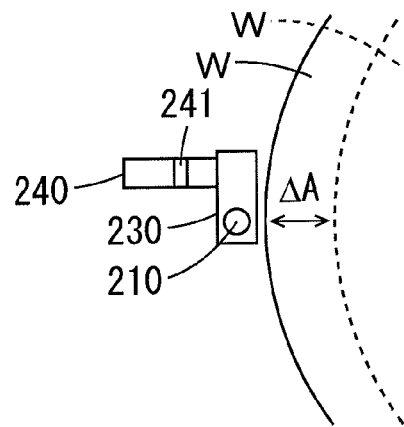
FIGS. 9A to 9C are diagrams for explaining the control of a position adjuster by a position setter and a position controller of FIG. 8.
Figure 9B:
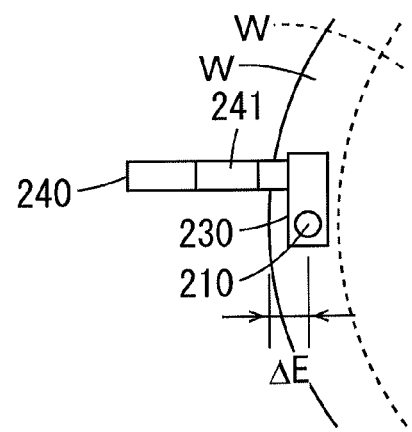
Figure 9C:
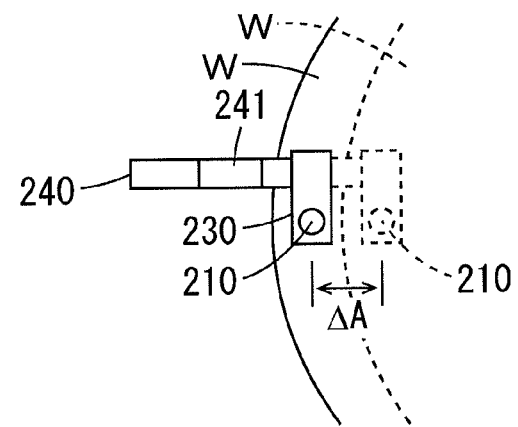

The control of the position adjuster 241 by the local controller 400 of FIG. 8 will be described. FIGS. 9A to 9C are diagrams for explaining the control of the position adjuster 241 by the position setter 423 and the position controller 424 of FIG. 8. FIGS. 10A to 10D are diagrams for explaining the control of the position adjuster 241 by the phase controller 425 of FIG. 8.

As described above, the change amount acquirer 422 acquires the position of the outer periphery of the substrate W and the position of tip end of the processing liquid nozzle 210 by the image processing. Further, the change amount acquirer 422 acquires the data showing the change with time of the position of the outer periphery of the rotating substrate W. In the example of FIG. 9A, the substrate W located at a position furthest outward during the rotation is indicated by a solid line, and the substrate W located at a position furthest inward is indicated by a dotted line. As shown in FIG. 9A, the acquired maximum change amount of the position of the outer periphery of the substrate W, that is, the amplitude of the change with time of the position is $\Delta A$.

The position setter 423 controls the position adjuster 241 such that the distance between the outer periphery of the substrate W and the tip end of the processing liquid nozzle 210 is a peripheral portion processing width $\Delta E$. In the example of FIG. 9B, the position adjuster 241 is controlled such that the tip end of the processing liquid nozzle 210 is arranged at a position located further inward than the furthest outward position of the outer periphery of the substrate W by the width ΔE.

As shown in FIG. 9C, the position controller 424 controls the position adjuster 241 such that the position of the tip end of the processing liquid nozzle 210 periodically changes at the amplitude ΔA from the above-mentioned position towards the rotational center of the spin chuck 25 of FIG. 3. The frequency of the change of the position of the tip end of the processing liquid nozzle 210 is equal to the rotational frequency of the spin chuck 25.

The change amount acquirer 422 acquires the data indicating the change with time of the position of the tip end of the processing liquid nozzle 210 in addition to the data indicating the change with time of the position of the outer periphery of the substrate W. Further, the change amount acquirer 422 acquires the data indicating the change with time of the relative position of the tip end of the processing liquid nozzle 210 with respect to the position of the outer periphery of the substrate W.

The changes of the positions based on these data are shown in FIGS. 10A to 10D. The abscissas of the FIGS. 10A to 10D indicate the time, and the ordinates of the FIGS. 10A to 10D indicate the position. In FIGS. 10A to 10D, the changes with time of the position of the outer periphery of the substrate W are indicated by dotted lines, and the changes with time of the position of the tip end of the processing liquid nozzle 210 are indicated by one-dot and dash lines. Further, the changes with time of the relative position of the tip end of the processing liquid nozzle 210 with respect to the position of the outer periphery of the substrate W are indicated by solid lines. Each change with time indicated by a solid line is equivalent to a difference between the change with time indicated by the dotted line and the change with time indicated by the one-dot and dash line.

Hereinafter, the change with time indicated by the dotted lines in FIGS. 10A to 10D are referred to as a change in substrate, and the change with time indicated by the one-dot and dash line is referred to as a change in nozzle, and the change with time indicated by the solid line is referred to as a change in difference. In FIGS. 10A to 10D, a positional shift of the peripheral portion processing width ΔE is ignored and the change in substrate and the change in nozzle are shown in order to facilitate understanding. The phase controller 425 allows the phase of the change in nozzle to substantially coincide with the phase of the change in substrate of FIGS. 10A to 10D by controlling the position adjuster 241 such that the change in nozzle is delayed. The amplitude ΔB of the change in difference changes in correspondence with the phase difference between the change in nozzle and the change in substrate.

Figure 10A:
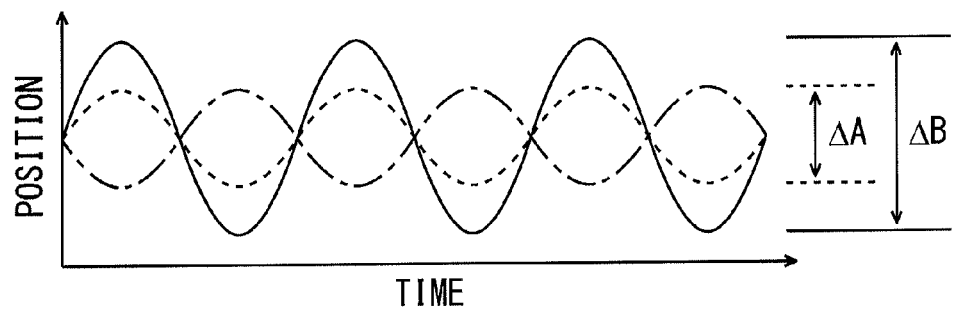
FIGS. 10A to 10D are diagrams for explaining the control of the position adjuster by the phase controller of FIG. 8.
Figure 10B:
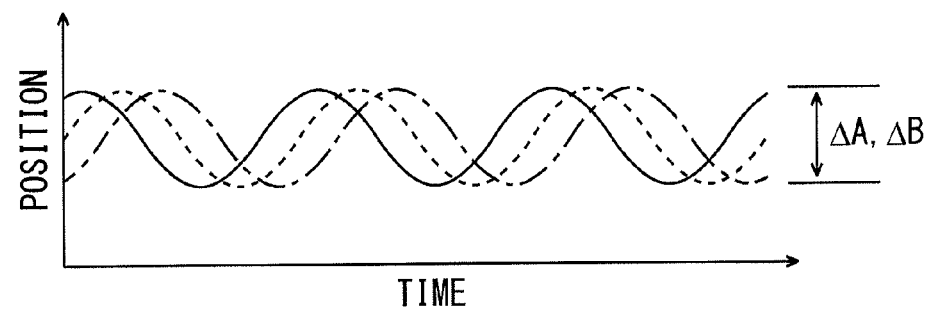
Figure 10C:
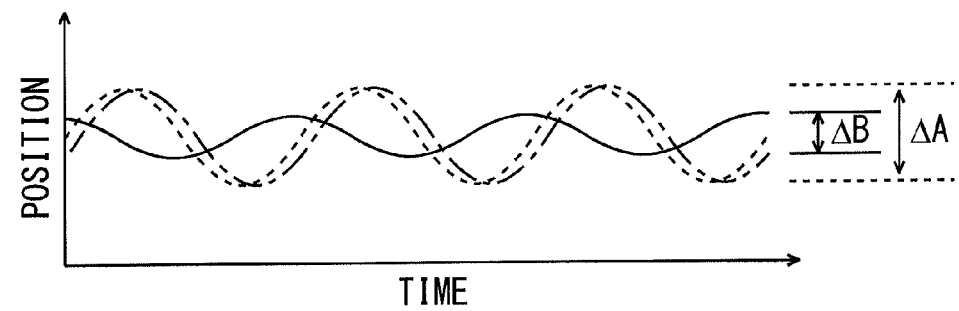
Figure 10D:
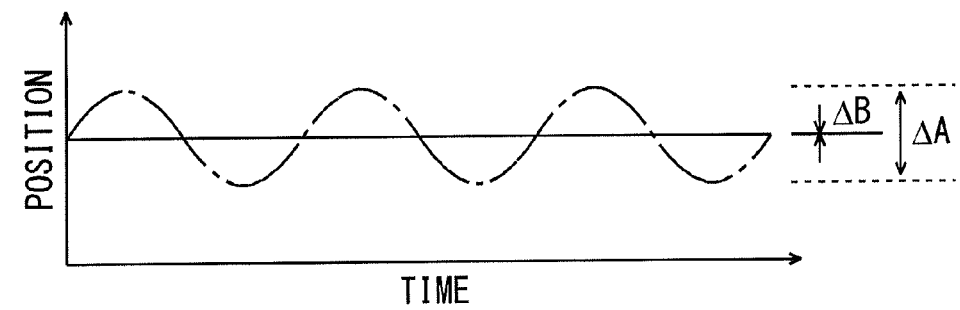

In the example of FIG. 10A, the phase difference between the change in nozzle and the change in substrate is π. In this case, the amplitude ΔB of the change in difference is maximized. In the example of FIG. 10B, the phase difference between the change in nozzle and the change in substrate is π/3. In this case, the amplitude width ΔB of the change in difference is smaller than the amplitude ΔB of FIG. 10A. In the example of FIG. 10C, the phase difference between the change in nozzle and the change in substrate is π/8. In this case, the amplitude ΔB of the change in difference is smaller than the amplitude ΔB of FIG. 10B. In the example of FIG. 10D, the phase difference between the change in nozzle and the change in substrate is 0. In this case, the amplitude ΔB of the change in difference is minimized.

In the present embodiment, a predetermined threshold value that is set in advance (50 μm, for example) is stored in the storage 410 of FIG. 8. The phase controller 425 controls the position adjuster 241 such that the amplitude ΔB of the change in difference is not more than the threshold value. Thus, the phase of the change in nozzle can substantially and easily coincide with the phase of the change in substrate at a high speed. After the phase of the change in nozzle substantially coincides with the phase of the change in substrate, the discharge controller 426 of FIG. 8 controls the valve 222 such that the rinse liquid is discharged from the processing liquid nozzle 210.

In the control of the above-mentioned local controller 400, the tip end of the processing liquid nozzle 210 tracks the position of the outer periphery of the substrate W even if the position of the outer periphery of the substrate W fluctuates between the solid line and dotted line of each of FIGS. 9A to 9C. Therefore, even in the case where the position of the substrate W slightly fluctuates due to the incompletion of the positioning of the substrate W, the processing for the peripheral portion processing width ΔE of the substrate can be performed with high accuracy.

(e) Substrate Peripheral Portion Processing

Figure 11:
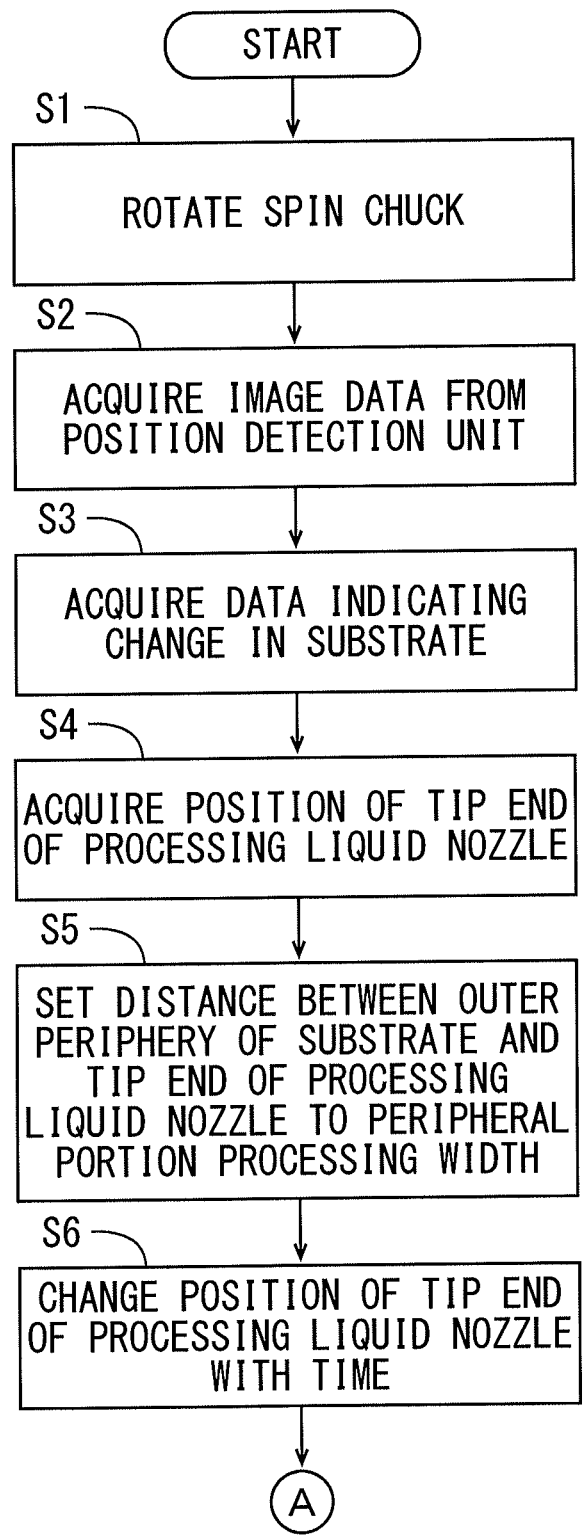
FIG. 11 is a flow chart showing substrate peripheral portion processing.
Figure 12:
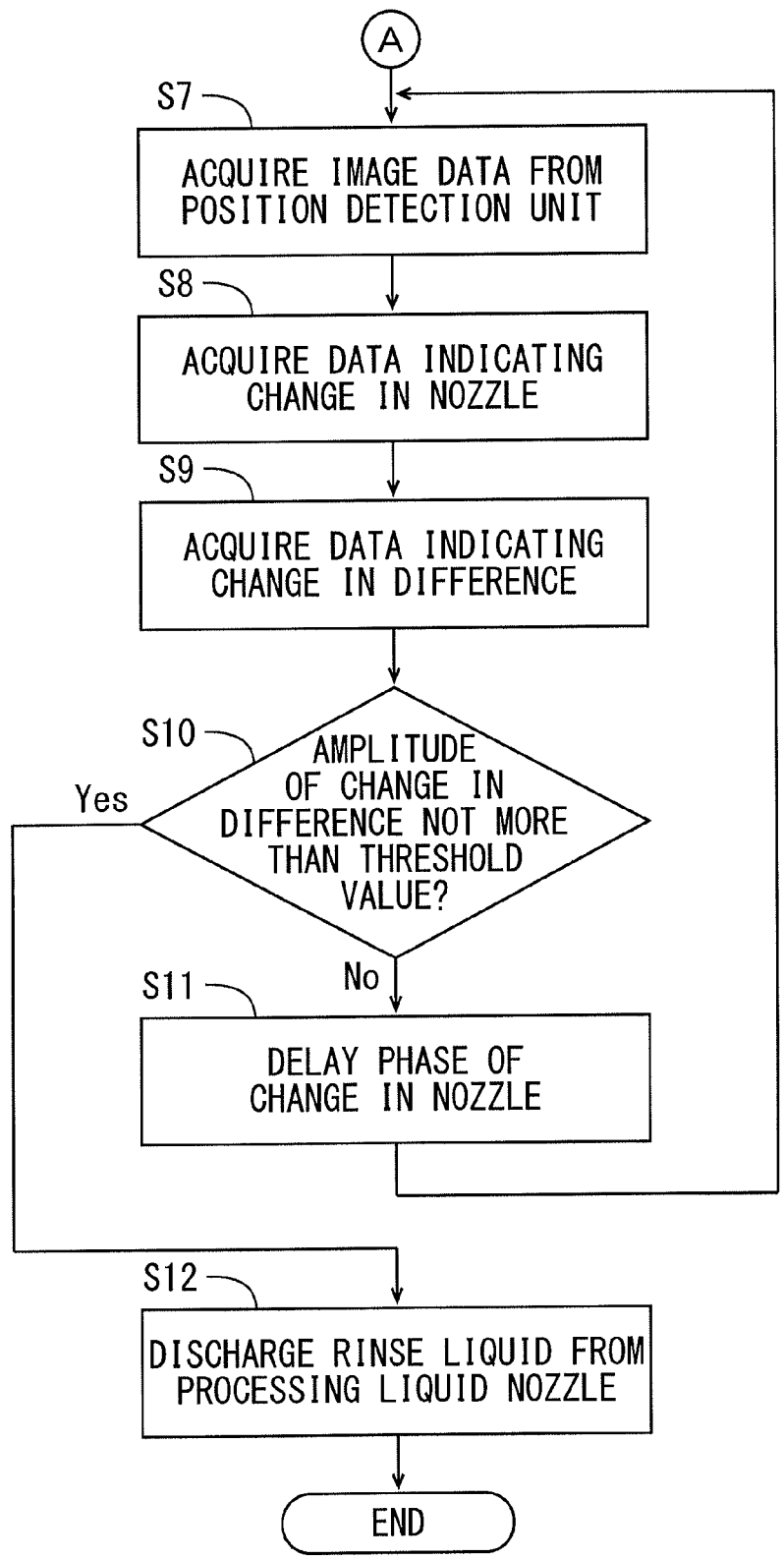
FIG. 12 is a flow chart showing the substrate peripheral portion processing.

FIGS. 11 and 12 are flow charts showing the substrate peripheral portion processing. The substrate peripheral portion processing by the controller 420 of the local controller 400 will be described below with reference to FIGS. 3 to 8. The substrate peripheral portion processing is performed when an anti-reflection liquid, a resist liquid or a resist cover liquid is discharged to the substrate W in the below-mentioned substrate processing.

First, the controller 420 rotates the spin chuck 25 holding the substrate W that is the target for processing (step S1). Next, the controller 420 acquires the image data from the position detection unit 300 (step S2). Subsequently, the controller 420 acquires the data indicating the change in substrate based on the acquired image data (step S3). Further, the controller 420 acquires the position of the tip end of the processing liquid nozzle 210 based on the acquired image data (step S4). Any of the processing of the steps S3, S4 may be performed first.

Then, the controller 420 sets the distance between the outer periphery of the substrate W and the tip end of the processing liquid nozzle 210 to the peripheral portion processing width ΔE by controlling the position adjuster 241 based on the change in substrate and the position of the tip end of the processing liquid nozzle 210 (step S5). Subsequently, the controller 420 changes the position of the tip end of the processing liquid nozzle 210 with time by controlling the position adjuster 241 (step S6). The amplitude and frequency of the change in nozzle are equal to the amplitude ΔA and frequency of the change in substrate, respectively.

Next, the controller 420 acquires the image data from the position detection unit 300 (step S7). Subsequently, the controller 420 acquires the data indicating the change in nozzle based on the acquired image data (step S8). Further, the controller 420 acquires the data indicating the change in difference based on the acquired image data (step S9).

The controller 420 determines whether the amplitude of the change in difference is not more than the threshold value stored in the storage 410 (step S10). In the case where the amplitude of the change in difference is larger than the threshold value, the controller 420 delays the phase of the change in nozzle by controlling the position adjuster 241 (step S11). Thereafter, the controller 420 returns to the process of the step S7. The process of the steps S7 to S11 is repeated until the amplitude of the change in difference is not more than the threshold value.

In the case where the amplitude of the change in difference is not more than the threshold value in the step S10, the controller 420 allows the rinse liquid to be discharged from the processing liquid nozzle 210 by controlling the valve 222. Thus, the controller 420 thereafter ends the substrate peripheral portion processing.

(4) Thermal Processing Section

Figure 13:
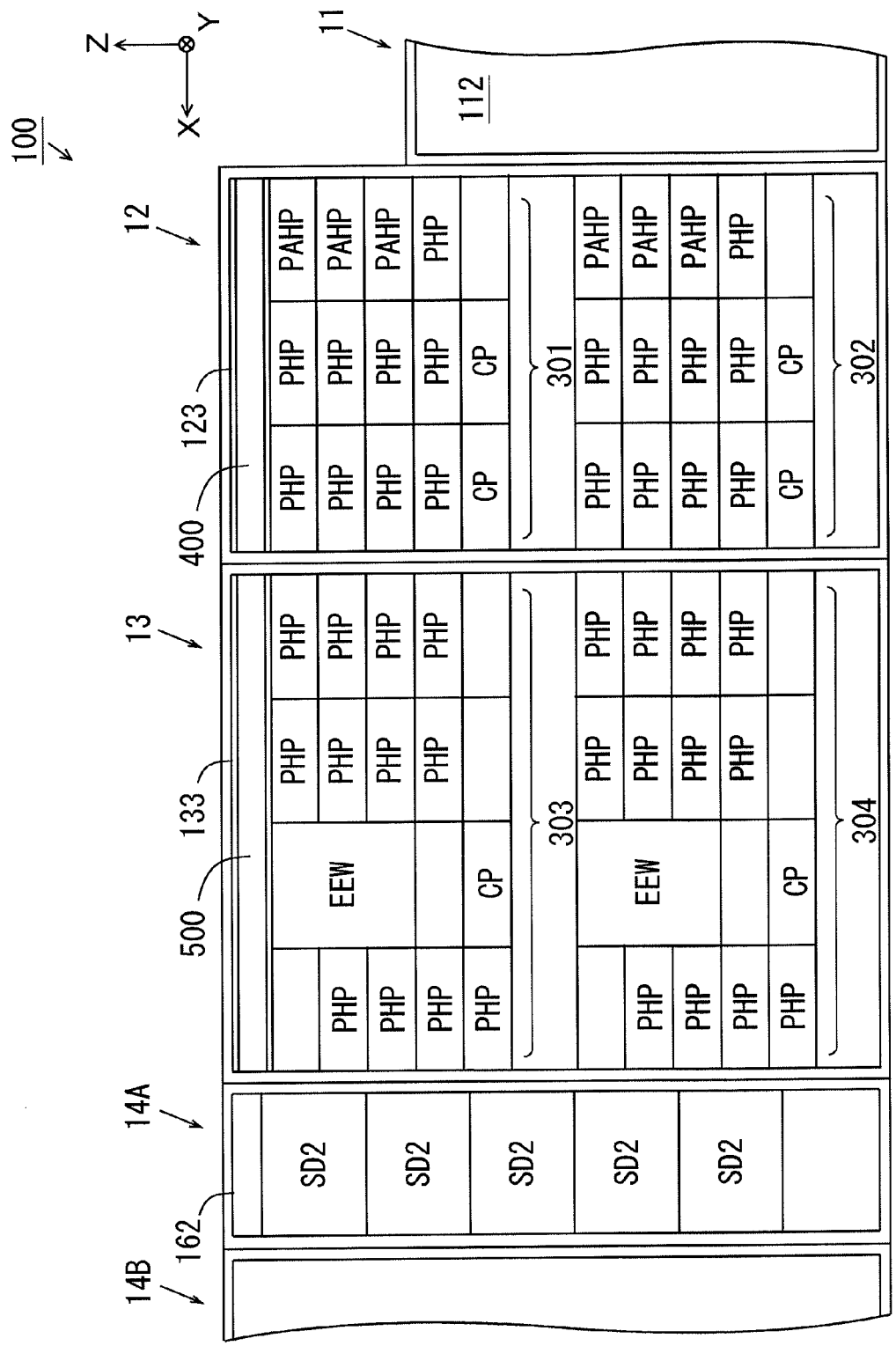
FIG. 13 is a schematic side view showing the inner configuration of thermal processing sections and a cleaning drying processing section of FIG. 1.

FIG. 13 is a schematic side view showing the inner configuration of the thermal processing sections 123, 133 and the cleaning drying processing section 162 of FIG. 1. As shown in FIG. 13, the thermal processing section 123 has an upper thermal processing section 301 provided above, and a lower thermal processing section 302 provided below. A plurality of thermal processing units PHP, a plurality of adhesion reinforcement processing units PAHP, and a plurality of cooling units (cooling plates) CP are provided in the upper thermal processing section 301 and the lower thermal processing section 302.

The local controller 400 of FIG. 8 is provided at the top of the thermal processing section 123. The local controller 400 controls the operations of the coating processing section 121, the transport section 122, and the thermal processing section 123 based on the instruction from the main controller 114 of FIG. 1.

In each thermal processing unit PHP, heating processing and cooling processing for the substrate W are performed. In each adhesion reinforcement processing unit PAHP, the adhesion reinforcement processing for improving the adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In the cooling unit CP, the cooling processing for the substrate W is performed.

The thermal processing section 133 has an upper thermal processing section 303 provided above and a lower thermal processing section 304 provided below. A cooling unit CP, a plurality of thermal processing units PHP, and an edge exposure unit EEW are provided in each of the upper thermal processing section 303 and the lower thermal processing section 304.

A local controller 500 is provided at the top of the thermal processing section 133. The local controller 500 controls the operations of the coating development processing section 131, the transport section 132, and the thermal processing section 133 based on the instruction from the main controller 114 of FIG. 1.

In the edge exposure unit EEW, exposure processing for a peripheral portion of the substrate W (edge exposure processing) is performed. The edge exposure processing is performed on the substrate W such that the resist film on the peripheral portion of the substrate W is removed during the subsequent development processing. Thus, in the case where the peripheral portion of the substrate W comes into contact with another member after the development processing, generation of particles caused by stripping of the resist film on the peripheral portion of the substrate W is prevented.

A plurality (five in this example) of cleaning drying processing units SD2 are provided in the cleaning drying processing section 162. In the cleaning drying processing unit SD2, the cleaning and drying processing for the substrate W after the exposure processing are performed.

(5) Transport Section

Figure 14:
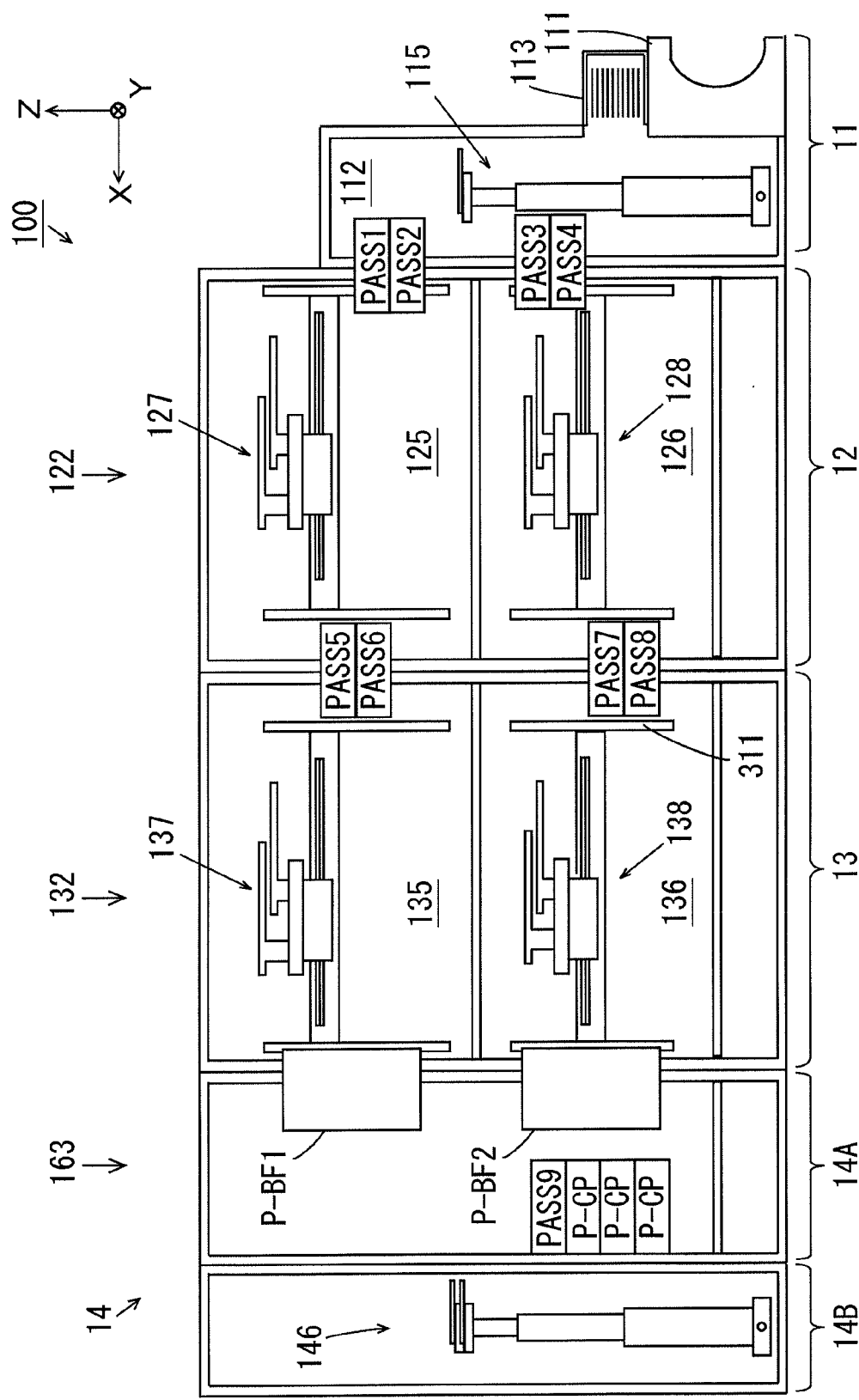
FIG. 14 is a schematic side view showing the inner configuration of transport sections.

FIG. 14 is a schematic side view showing the inner configuration of the transport sections 122, 132, 163. As shown in FIG. 14, the transport section 122 has an upper transport chamber 125 and a lower transport chamber 126. The transport section 132 has an upper transport chamber 135 and a lower transport chamber 136. The upper transport chamber 125 is provided with a transport mechanism 127, and the lower transport chamber 126 is provided with a transport mechanism 128. Further, the upper transport chamber 135 is provided with a transport mechanism 137, and the lower transport chamber 136 is provided with a transport mechanism 138.

The upper thermal processing section 301 (FIG. 13) is opposite to the coating processing chambers 21, 22 (FIG. 2) with the upper transport chamber 125 sandwiched therebetween. The lower thermal processing section 302 (FIG. 13) is opposite to the coating processing chambers 23, 24 (FIG. 2) with the lower transport chamber 126 sandwiched therebetween. The upper thermal processing section 303 (FIG. 13) is opposite to the development processing chamber 31 and the coating processing chamber 32 (FIG. 2) with the upper transport chamber 135 sandwiched therebetween. The lower thermal processing section 304 (FIG. 13) is opposite to the development processing chamber 33 and the coating processing chamber 34 (FIG. 2) with the lower transport chamber 136 sandwiched therebetween.

As shown in FIG. 14, the substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The placement buffer unit P-BF1 is configured to be capable of carrying in and carrying out the substrate W by the transport mechanism 137 and the transport mechanisms 141, 142 (FIG. 1). The placement buffer unit P-BF2 is configured to be capable of carrying in and carrying out the substrate W by the transport mechanism 138 and the transport mechanisms 141, 142 (FIG. 1). Further, the substrate platform PASS9 and the placement cooling unit P-CP are configured to be capable of carrying in and carrying out the substrate W by the transport mechanisms 141, 142 (FIG. 1) and the transport mechanism 146.

The substrates W transported from the indexer block 11 to the first processing block 12 are placed on the substrate platform PASS1 and the substrate platform PASS3. The substrates W transported from the first processing block 12 to the indexer block 11 are placed on the substrate platform PASS2 and the substrate platform PASS4.

The substrates W transported from the first processing block 12 to the second processing block 13 are placed on the substrate platform PASS5 and the substrate platforms PASS7. The substrates W transported from the second processing block 13 to the first processing block 12 are placed on the substrate platform PASS6 and the substrate platform PASS8.

The substrates W transported from the second processing block 13 to the cleaning drying processing block 14A are placed on the placement buffer units P-BF1, P-BF2. The substrates W transported from the cleaning drying processing block 14A to the carry-in carry-out block 14B are placed on the placement cooling units P-CP. The substrates W transported from the carry-in carry-out block 14B to the cleaning drying processing block 14A are placed on the substrate platform PASS9.

The transport mechanism 127 performs receiving and transferring of the substrates W with the coating processing chambers 21, 22 (FIG. 2), the substrate platforms PASS1, PASS2, PASS5, PASS6 (FIG. 14), and the upper thermal processing section 301 (FIG. 13). The transport mechanism 128 performs receiving and transferring of the substrates W with the coating processing chambers 23, 24 (FIG. 2), the substrate platforms PASS3, PASS4, PASS7, PASS8 (FIG. 14) and the lower thermal processing section 302 (FIG. 13).

The transport mechanism 137 performs receiving and transferring of the substrates W with the development processing chamber 31 (FIG. 2), the coating processing chamber 32 (FIG. 2), the substrate platforms PASS5, PASS6 (FIG. 14), the platform buffer unit P-BF1 (FIG. 14), and the upper thermal processing section 303 (FIG. 13). The transport mechanism 138 performs receiving and transferring of the substrates W with the development processing chamber 33 (FIG. 2), the coating processing chamber 34 (FIG. 2), the substrate platforms PASS7, PASS8 (FIG. 14), the placement buffer unit P-BF2 (FIG. 14), and the lower thermal processing section 304 (FIG. 13).

(6) Substrate Processing

The substrate processing will be described with reference to FIGS. 1, 2, 13 and 14. Each carrier 113 in which unprocessed substrates W are stored is placed on each carrier platform 111 in the indexer block 11 (FIG. 1). The transport mechanism 115 transports the unprocessed substrate W from the carrier 113 to the substrate platform PASS1, PASS3 (FIG. 14). Further, the transport mechanism 115 transports the processed substrate W that is placed on the substrate platform PASS2, PASS4 (FIG. 14) to the carrier 113.

In the first processing block 12, the transport mechanism 127 (FIG. 14) sequentially transports the unprocessed substrate W that is placed on the substrate platform PASS1 to the adhesion reinforcement processing unit PAHP (FIG. 13), the cooling unit CP (FIG. 13), and the coating processing chamber 22 (FIG. 2). Next, the transport mechanism 127 sequentially transports the substrate W in the coating processing chamber 22 to the thermal processing unit PHP (FIG. 13), the cooling unit CP (FIG. 13), the coating processing chamber 21 (FIG. 2), the thermal processing unit PHP (FIG. 13), and the substrate platform PASS5 (FIG. 14).

In this case, after the adhesion reinforcement processing is performed on the substrate W in the adhesion reinforcement processing unit PAHP, the substrate W is cooled in the cooling unit CP to a temperature suitable for the formation of the anti-reflection film. Next, an anti-reflection film is formed on the substrate W by the coating processing unit 129 (FIG. 2) in the coating processing chamber 22. Subsequently, after the thermal processing for the substrate W is performed in the thermal processing unit PHP, the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 14) to the substrate platform PASS2 (FIG. 14).

The transport mechanism 128 (FIG. 14) sequentially transports the unprocessed substrate W that is placed on the substrate platform PASS3 to the adhesion reinforcement processing unit PAHP (FIG. 13), the cooling unit CP (FIG. 13), and the coating processing chamber 24 (FIG. 2). Next, the transport mechanism 128 sequentially transports the substrate W in the coating processing chamber 24 to the thermal processing unit PHP (FIG. 13), the cooling unit CP (FIG. 13), the coating processing chamber 23 (FIG. 2), the thermal processing unit PHP (FIG. 13), and the substrate platform PASS7 (FIG. 14).

Further, the transport mechanism 128 (FIG. 14) transports the substrate W after the development processing that is placed on the substrate platform PASS8 (FIG. 14) to the substrate platform PASS4 (FIG. 14). The contents of processing for the substrate W in the coating processing chambers 23, 24 (FIG. 2) and the lower thermal processing section 302 (FIG. 13) are respectively similar to the contents of processing for the substrate W in the above-mentioned coating processing chambers 21, 22 (FIG. 2) and the upper thermal processing section 301 (FIG. 13).

In the second processing block 13, the transport mechanism 137 (FIG. 14) sequentially transports the substrate W after the formation of the resist film that is placed on the substrate platform PASS5 to the coating processing chamber 32, the thermal processing unit PHP, the edge exposure unit EEW (FIG. 13) and the placement buffer unit P-BF1 (FIG. 14). In this case, after the resist cover film is formed on the substrate W in the coating processing chamber 32, and the thermal processing for the substrate W is performed in the thermal processing unit PHP, the edge exposure processing is performed on the substrate W in the edge exposure unit EEW. The substrate W after the edge exposure processing is placed on the placement buffer unit P-BF1.

Further, the transport mechanism 137 (FIG. 14) takes out the substrate W after exposure processing and the thermal processing from the thermal processing unit PHP (FIG. 13) adjacent to the interface block 14. The transport mechanism 137 sequentially transports the substrate W to the cooling unit CP (FIG. 13), the development processing chamber 31 (FIG. 2), the thermal processing unit PHP (FIG. 13), and the substrate platform PASS6 (FIG. 14).

In this case, after the substrate W is cooled in the cooling unit CP to a temperature suitable for the development processing, the development processing for the substrate W is performed by the development processing unit 139 in the development processing chamber 31. Thereafter, the thermal processing for the substrate W is performed in the thermal processing unit PHP, and the substrate W is placed on the substrate platform PASS6.

The transport mechanism 138 (FIG. 14) sequentially transports the substrate W after the formation of the resist film that is placed on the substrate platform PASS7 to the coating processing chamber 34, the thermal processing unit PHP, the edge exposure unit EEW (FIG. 13), and the placement buffer unit P-BF2 (FIG. 14).

Further, the transport mechanism 138 (FIG. 14) takes out the substrate W after the exposure processing and the thermal processing from the thermal processing unit PHP (FIG. 13) adjacent to the interface block 14. The transport mechanism 138 sequentially transports the substrate W to the cooling unit CP (FIG. 13), the development processing chamber 33 (FIG. 2), the thermal processing unit PHP (FIG. 13), and the substrate platform PASS8 (FIG. 14). The contents of processing for the substrate W in the development processing chamber 33, the coating processing chamber 34, and the lower thermal processing section 304 are respectively similar to the contents of processing for the substrate W in the above-mentioned development processing chamber 31, the coating processing chamber 32, and the upper thermal processing section 303.

In the cleaning drying processing block 14A, the transport mechanism 141 (FIG. 1) sequentially transports the substrate W that is placed on the placement buffer unit P-BF1, P-BF2 (FIG. 14) to the cleaning drying processing unit SD1 (FIG. 2) and the placement cooling unit P-CP (FIG. 14). In this case, after cleaning and drying processing for the substrate W are performed in the cleaning drying processing unit SD1, the substrate W is cooled to a temperature suitable for the exposure processing by the exposure device 15 (FIG. 1) in the placement cooling unit P-CP.

The transport mechanism 142 (FIG. 1) sequentially transports the substrate W after the exposure processing that is placed on the substrate platform PASS9 (FIG. 14) to the cleaning drying processing unit SD2 (FIG. 13), and the thermal processing unit PHP (FIG. 13) in the upper thermal processing section 303 or the lower thermal processing unit 304. In this case, after cleaning and drying processing for the substrate W are performed in the cleaning drying processing unit SD2, the exposure bake (PEB) processing is performed in the thermal processing unit PHP.

In the carry-in carry-out block 14B, the transport mechanism 146 (FIG. 1) transports the substrate W before the exposure processing that is placed on the placement cooling unit P-CP (FIG. 14) to a substrate inlet 15a of the exposure device 15 (FIG. 1). Further, the transport mechanism 146 (FIG. 1) takes out the substrate W after the exposure processing from the substrate outlet 15b of the exposure device 15 (FIG. 1), and transports the substrate W to the substrate platform PASS9 (FIG. 14).

In the present embodiment, the processing for the substrate W in the coating processing chambers 21, 22, 32, the development processing chamber 31 and the upper thermal processing sections 301, 303 that are provided above and the processing for the substrate W in the coating processing chambers 23, 24, 34, the development processing chamber 33 and the lower thermal processing sections 302, 304 that are provided below can be concurrently performed. Thus, it is possible to improve throughput without increasing a footprint.

(7) Effects

In the substrate processing apparatus 100 according to the present embodiment, the position of the outer periphery of the rotating substrate W and the position of the processing liquid nozzle 210 are detected by the position detection unit 300. The relative position of the processing liquid nozzle 210 with respect to the spin chuck 25 can be adjusted by the position adjuster 241 in a direction passing through the rotational center of the spin chuck 25 and parallel with the rotating substrate W. The amplitude ΔA of the change with time of the position of the outer periphery of the substrate W (the change in substrate) detected during the rotation of the substrate W is acquired by the change amount acquirer 422.

The relative position of the processing liquid nozzle 210 with respect to the spin chuck 25 is periodically changed by the position adjuster 241 at the frequency equal to the rotational frequency of the spin chuck 25, and the amplitude ΔA. Thereafter, the phase difference between the change in nozzle and the change in substrate is adjusted to not more than the threshold value stored in the storage 410 by the position adjuster 241. When the phase difference is not more than the threshold value, the processing liquid nozzle 210 is moved to track the change of the position of the outer periphery of the substrate W. In this state, the processing liquid is discharged from the processing liquid nozzle 210 to the peripheral portion of the rotating substrate W.

This configuration enables the change of the relative position of the processing liquid nozzle 210 with respect to the spin chuck 25 to be accurately synchronized with the change of the position of the outer periphery of the substrate W. Thus, the processing liquid nozzle 210 can be arranged at a desired position in the peripheral portion of the substrate W with high accuracy. As a result, the processing for the peripheral portion of the substrate W can be performed with high accuracy.

(8) Other Embodiments (a) In the above-mentioned embodiment, the tip end of the processing liquid nozzle 210 is positioned with reference to the furthest outward position of the outer periphery of the substrate W in the processing for setting the peripheral portion processing width ΔE of FIG. 9B. However, the present invention is not limited to this. As long as the tip end of the processing liquid nozzle 210 tracks the position of the outer periphery of the substrate W and the peripheral portion of the substrate W can be processed with the desired peripheral portion processing width ΔE, the tip end of the processing liquid nozzle 210 may be positioned with reference to the position of the outer periphery of the substrate W at an arbitrary time point.

For example, the tip end of the processing liquid nozzle 210 may be positioned with reference to the furthest inward position of the outer periphery of the substrate W. Alternatively, the tip end of the processing liquid nozzle 210 may be positioned with reference to an average position of the outer periphery of the rotating substrate W.

(b) While the processing for setting the peripheral portion processing width ΔE (step S5) is performed before the processing for changing the position of the tip end of the processing liquid nozzle 210 with time (step S6) in the above-mentioned embodiment, the present invention is not limited to this. As long as being performed before the processing for discharging the rinse liquid from the processing liquid nozzle 210 (step S12), the processing for setting the peripheral portion processing width ΔE may be performed at any time point.

For example, the processing for setting the peripheral portion processing width ΔE may be performed after the processing for delaying the phase of the change in nozzle (step S11). Alternatively, after being performed before the processing for changing the position of the tip end of the processing liquid nozzle 210 with time, the processing for setting the peripheral portion processing width LE may be performed again later than the processing for delaying the phase of the change in nozzle.

(c) In the above-mentioned embodiment, it is considered that the phase of the change in nozzle substantially coincides with the phase of the change in substrate when the amplitude ΔB of the change in difference is not more than the threshold value. However, the present invention is not limited to this. It may be considered that the phase of the change in nozzle coincides with the phase of the change in substrate when the amplitude ΔB of the change in difference is a minimum value.

(d) In the above-mentioned embodiment, whether the phase of the change in nozzle substantially coincides with the phase of the change in substrate is determined based on the amplitude ΔB of the change in difference. However, the present invention is not limited to this. Whether the phase of the change in nozzle substantially coincides with the phase of the change in substrate may be determined by acquisition of the phase of the change in nozzle and the phase of the change in substrate and comparison of these phases.

(e) While the position adjuster 241 includes a piezoelectric element in the above-mentioned embodiment, the present invention is not limited to this. The position adjuster 241 may include a voice coil motor, for example, and may include another type of an actuator.

(f) In the above-mentioned embodiment, the position adjuster 241 is attached to the nozzle supporter 230 to be capable of adjusting the position of the tip end of the processing liquid nozzle 210. In this case, a small-size position adjuster 241 can be used. Therefore, the substrate processing apparatus 100 can be made compact. Further, because the processing liquid nozzle 210 is light, electric power for driving the position adjuster 241 can be reduced.

While the position adjuster 241 is preferably provided to be capable of adjusting the position of the tip end of the processing liquid nozzle 210 in this manner, the present invention is not limited to this. The position adjuster 241 may be provided at the spin chuck 25 to be capable of adjusting the position of the outer periphery of the substrate W.

(g) In the above-mentioned embodiment, the position detection unit 300 is constituted by the common imaging device 310 that detects the position of the outer periphery of the substrate W and the position of the tip end of the processing liquid nozzle 210. In this case, it is not necessary to provide the plurality of imaging devices 310 in the substrate processing apparatus 100. Therefore, an increase in size of the substrate processing apparatus 100 can be prevented.

While the position detection unit 300 is preferably constituted by the common imaging device 310 that detects the position of the outer periphery of the substrate W and the position of the tip end of the processing liquid nozzle 210 in this manner, the present invention is not limited to this. The position detection unit 300 may be constituted by two imaging devices 310 that respectively detect the position of the outer periphery of the substrate W and the position of the tip end of the processing liquid nozzle 210. In this case, flexibility of the arrangement of the processing liquid nozzle 210 can be improved without restriction on a positional relationship between the outer periphery of the substrate W and the processing liquid nozzle 210.

(h) In the above-mentioned embodiment, the position detection unit 300 is constituted by the imaging device 310. In this case, the amplitude ΔA can be easily and accurately acquired by the image processing. While the position detection unit 300 is preferably constituted by the imaging device 310 in this manner, the present invention is not limited to this. The position detection unit 300 may be constituted by a detection device different from the imaging device 310. The detection device may include a light emitter and a light receiver arranged to be opposite to each other with the outer periphery of the substrate W sandwiched therebetween, for example.

(i) While the imaging device 310 includes the reflection mirror 312 in the above-mentioned embodiment, the present invention is not limited to this. The imaging device 310 does not have to include the reflection mirror 312. In this case, the CCD line sensor 313 is arranged to directly detect the light reflected on the substrate W.

(j) While processing for removing an anti-reflection liquid, a resist liquid, or a resist cover liquid applied to the peripheral portion of the substrate W is performed as the substrate peripheral portion processing in the above-mentioned embodiment, the present invention is not limited to this. Processing for forming a film of a processing liquid on the peripheral portion of the substrate W may be performed as the substrate peripheral portion processing.

For example, contaminants are sometimes likely to adhere to the peripheral portion of the substrate W due to the roughness of the surface of the peripheral portion of the substrate W. In such a case, the peripheral portion of the substrate W is covered by formation of the film of the processing liquid on the peripheral portion of the substrate W. Thus, a foreign matter can be prevented from adhering to the peripheral portion of the substrate W.

(9) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the substrate processing apparatus 100 is an example of a substrate processing apparatus, the spin chuck 25 is an example of a rotation holder, the processing liquid nozzle 210 is an example of a processing liquid nozzle. The nozzle mechanism 200 is an example of a nozzle mechanism, the position adjuster 241 is an example of a position adjuster, the position detection unit 300 is an example of a position detection unit, the change amount acquirer 422 is an example of a change amount acquirer, and the position controller 424 is an example of a position controller. The phase controller 425 is an example of a phase controller, the discharge controller 426 is an example of a discharge controller, the nozzle supporter 230 is an example of a nozzle supporter, and the imaging device 310 is an example of a detection device or first and second detection devices.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for substrate processing using various types of processing liquids.

I claim:

1. A substrate processing apparatus that performs processing on a substrate having an at least partially circular outer periphery, comprising:
    a rotation holder configured to hold and rotate the substrate;
    a rotation controller that controls an operation of the rotation holder;
    a nozzle mechanism including a processing liquid nozzle that discharges a processing liquid to a peripheral portion of the substrate rotated by the rotation holder;
    a position adjuster provided to be capable of adjusting a relative position of the processing liquid nozzle with respect to the rotation holder in a direction passing through a rotational center of the rotation holder and parallel with the substrate rotated by the rotation holder;
    a position detector arranged to detect a position of the outer periphery of the substrate held by the rotation holder and a position of the processing liquid nozzle;
    a change amount acquirer that acquires an amplitude of a change with time of the position of the outer periphery of the substrate detected by the position detector during rotation of the substrate by the rotation holder as a first amplitude;
    a position setter that acquires the position of the outer periphery of the substrate and a position of a tip end of the processing liquid nozzle based on a result of the detection by the position detector, and controls the position adjuster such that the position of the tip end of the processing liquid nozzle with respect to the position of the outer periphery of the substrate is set to a predetermined value;
    a position controller that controls the position adjuster such that the relative position of the processing liquid nozzle with respect to the rotation holder by the rotation controller is periodically changed at a frequency equal to a rotational frequency of the rotation holder, and the first amplitude acquired by the change amount acquirer;
    a phase controller that controls the position adjuster such that a difference between a phase of a change with time of the position of the processing liquid nozzle detected by the position detector and a phase of a change with time of the position of the outer periphery of the substrate detected by the position detector is not more than a predetermined value; and
    a discharge controller that controls the nozzle mechanism such that a processing liquid is discharged from the processing liquid nozzle after the position adjuster is controlled by the phase controller.

2. The substrate processing apparatus according to claim 1,
    the change amount acquirer acquires an amplitude of a change with time of the difference between the position of the outer periphery of the substrate detected by the position detector and the position of the processing liquid nozzle detected by the position detector during the rotation of the substrate by the rotation holder as a second amplitude, and
    the phase controller controls the position adjuster such that the second amplitude acquired by the change amount acquirer is not more than a predetermined threshold value.

3. The substrate processing apparatus according to claim 2, wherein
    the threshold value is 50 μm.

4. The substrate processing apparatus according to claim 2, wherein
    the phase controller controls the position adjuster such that the second amplitude acquired by the change amount acquirer is minimized.

5. The substrate processing apparatus according to claim 1, wherein
    resolution of position adjustment of the position adjuster is not more than 50 μm.

6. The substrate processing apparatus according to claim 1, wherein
    the position adjuster includes a piezoelectric element or a voice coil motor.

7. The substrate processing apparatus according to claim 1, wherein
    the nozzle mechanism includes a nozzle supporter that supports the processing liquid nozzle, and
    the position adjuster is provided in the nozzle supporter.

8. The substrate processing apparatus according to claim 1, wherein
    the position detector includes a single detector that detects the position of the outer periphery of the substrate and the position of the processing liquid nozzle.

9. The substrate processing apparatus according to claim 1, wherein
    the position detector includes a first detector that detects the position of the outer periphery of the substrate and a second detector that detects the position of the processing liquid nozzle.

10. The substrate processing apparatus according to claim 1, wherein
    the position detector produces image data indicating images of the outer periphery of the substrate and the processing liquid nozzle, and detects the position of the outer periphery of the substrate and the position of the processing liquid nozzle based on the produced image data, and
    the change amount acquirer acquires the first amplitude by processing the image data produced by the position detector.

11. The substrate processing apparatus according to claim 1, wherein
    the processing liquid nozzle discharges a removal liquid that removes a liquid applied to the peripheral portion of the substrate as a processing liquid.

12. The substrate processing apparatus according to claim 1, wherein
    the processing liquid nozzle discharges a processing liquid for forming a processing film on the peripheral portion of the substrate.

* * * * *